(12) United States Patent
Chui et al.

(10) Patent No.: US 7,684,104 B2
(45) Date of Patent: Mar. 23, 2010

(54) MEMS USING FILLER MATERIAL AND METHOD

(75) Inventors: Clarence Chui, San Mateo, CA (US); Jeffrey B. Sampsell, San Francisco, CA (US)

(73) Assignee: IDC, LLC, Pleasanton, CA (US)

( * ) Notice: Subject to any disclaimer, the term of this patent is extended or adjusted under 35 U.S.C. 154(b) by 241 days.

(21) Appl. No.: 11/208,809

(22) Filed: Aug. 22, 2005

(65) Prior Publication Data

US 2006/0066936 A1  Mar. 30, 2006

Related U.S. Application Data

(60) Provisional application No. 60/613,475, filed on Sep. 27, 2004.

(51) Int. Cl.
*G02B 26/00* (2006.01)
(52) U.S. Cl. .................. 359/290; 359/291; 359/292
(58) Field of Classification Search ........ 359/290, 359/292, 295, 298, 220, 222, 223, 224, 320, 359/322, 245, 291, 248, 254
See application file for complete search history.

(56) References Cited

U.S. PATENT DOCUMENTS

| | | | |
|---|---|---|---|
| 2,534,846 A | 12/1950 | Ambrise et al. | |
| 3,439,973 A | 4/1969 | Paul et al. | |
| 3,443,854 A | 5/1969 | Weiss | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |
| 4,377,324 A | 3/1983 | Durand et al. | |
| 4,389,096 A | 6/1983 | Hori et al. | |

(Continued)

FOREIGN PATENT DOCUMENTS

CH 681 047 12/1992

(Continued)

OTHER PUBLICATIONS

PCT Search Report and Written Opinion for International App. No. PCT/US2005/032647.

(Continued)

*Primary Examiner*—Ricky L Mack
*Assistant Examiner*—Tuyen Q Tra
(74) *Attorney, Agent, or Firm*—Knobbe, Martens, Olson & Bear, LLP

(57) ABSTRACT

Described is an apparatus, method for manufacturing, and systems comprising a MEMS device, for example, an interferometric modulator, comprising a substrate, a movable mirror, a deformable layer, and a support structure. In some embodiments, the support structure comprises a plurality of support posts. A connector secures the movable mirror secured to the deformable layer. At least one of the connector and the support post is a composite comprising a first component and a second component, where at the first component forms at least a portion of at least one of the perimeter of the connector and support post.

19 Claims, 22 Drawing Sheets

U.S. PATENT DOCUMENTS

| | | | |
|---|---|---|---|
| 4,392,711 A | 7/1983 | Moraw et al. | |
| 4,403,248 A | 9/1983 | te Velde | |
| 4,441,791 A | 4/1984 | Hornbeck | |
| 4,445,050 A | 4/1984 | Marks | |
| 4,459,182 A | 7/1984 | te Velde | |
| 4,482,213 A | 11/1984 | Piliavin et al. | |
| 4,500,171 A | 2/1985 | Penz et al. | |
| 4,519,676 A | 5/1985 | te Velde | |
| 4,531,126 A | 7/1985 | Sadones | |
| 4,566,935 A | 1/1986 | Hornbeck | |
| 4,571,603 A | 2/1986 | Hornbeck et al. | |
| 4,596,992 A | 6/1986 | Hornbeck | |
| 4,615,595 A | 10/1986 | Hornbeck | |
| 4,617,608 A | 10/1986 | Blonder et al. | |
| 4,662,746 A | 5/1987 | Hornbeck | |
| 4,663,083 A | 5/1987 | Marks | |
| 4,681,403 A | 7/1987 | te Velde et al. | |
| 4,710,732 A | 12/1987 | Hornbeck | |
| 4,748,366 A | 5/1988 | Taylor | |
| 4,786,128 A | 11/1988 | Birnbach | |
| 4,790,635 A | 12/1988 | Apsley | |
| 4,856,863 A | 8/1989 | Sampsell et al. | |
| 4,859,060 A | 8/1989 | Kitagiri et al. | |
| 4,900,136 A | 2/1990 | Goldburt et al. | |
| 4,900,395 A | 2/1990 | Syverson et al. | |
| 4,937,496 A | 6/1990 | Neiger et al. | |
| 4,954,789 A | 9/1990 | Sampsell | |
| 4,956,619 A | 9/1990 | Hornbeck | |
| 4,965,562 A | 10/1990 | Verhulst | |
| 4,982,184 A | 1/1991 | Kirkwood | |
| 5,018,256 A | 5/1991 | Hornbeck | |
| 5,022,745 A | 6/1991 | Zayhowski et al. | |
| 5,028,939 A | 7/1991 | Hornbeck et al. | |
| 5,037,173 A | 8/1991 | Sampsell et al. | |
| 5,044,736 A | 9/1991 | Jaskie et al. | |
| 5,061,049 A | 10/1991 | Hornbeck | |
| 5,075,796 A | 12/1991 | Schildkraut et al. | |
| 5,078,479 A | 1/1992 | Vuilleumier | |
| 5,079,544 A | 1/1992 | DeMond et al. | |
| 5,083,857 A | 1/1992 | Hornbeck | |
| 5,096,279 A | 3/1992 | Hornbeck et al. | |
| 5,099,353 A | 3/1992 | Hornbeck | |
| 5,124,834 A | 6/1992 | Cusano et al. | |
| 5,136,669 A | 8/1992 | Gerdt | |
| 5,142,405 A | 8/1992 | Hornbeck | |
| 5,142,414 A | 8/1992 | Koehler | |
| 5,153,771 A | 10/1992 | Link et al. | |
| 5,162,787 A | 11/1992 | Thompson et al. | |
| 5,168,406 A | 12/1992 | Nelson | |
| 5,170,156 A | 12/1992 | DeMond et al. | |
| 5,172,262 A | 12/1992 | Hornbeck | |
| 5,179,274 A | 1/1993 | Sampsell | |
| 5,192,395 A | 3/1993 | Boysel et al. | |
| 5,192,946 A | 3/1993 | Thompson et al. | |
| 5,206,629 A | 4/1993 | DeMond et al. | |
| 5,212,582 A | 5/1993 | Nelson | |
| 5,214,419 A | 5/1993 | DeMond et al. | |
| 5,214,420 A | 5/1993 | Thompson et al. | |
| 5,216,537 A | 6/1993 | Hornbeck | |
| 5,226,099 A | 7/1993 | Mignardi et al. | |
| 5,228,013 A | 7/1993 | Bik | |
| 5,231,532 A | 7/1993 | Magel et al. | |
| 5,233,385 A | 8/1993 | Sampsell | |
| 5,233,456 A | 8/1993 | Nelson | |
| 5,233,459 A | 8/1993 | Bozler et al. | |
| 5,254,980 A | 10/1993 | Hendrix et al. | |
| 5,272,473 A | 12/1993 | Thompson et al. | |
| 5,278,652 A | 1/1994 | Urbanus et al. | |
| 5,280,277 A | 1/1994 | Hornbeck | |
| 5,287,096 A | 2/1994 | Thompson et al. | |
| 5,293,272 A | 3/1994 | Jannson et al. | |
| 5,296,950 A | 3/1994 | Lin et al. | |
| 5,299,041 A | 3/1994 | Morin et al. | |
| 5,305,640 A | 4/1994 | Boysel et al. | |
| 5,311,360 A | 5/1994 | Bloom et al. | |
| 5,312,513 A | 5/1994 | Florence et al. | |
| 5,323,002 A | 6/1994 | Sampsell et al. | |
| 5,324,683 A | 6/1994 | Fitch et al. | |
| 5,325,116 A | 6/1994 | Sampsell | |
| 5,326,430 A | 7/1994 | Cronin et al. | |
| 5,327,286 A | 7/1994 | Sampsell et al. | |
| 5,330,617 A | 7/1994 | Haond | |
| 5,331,454 A | 7/1994 | Hornbeck | |
| 5,339,116 A | 8/1994 | Urbanus et al. | |
| 5,345,328 A | 9/1994 | Fritz et al. | |
| 5,347,377 A | 9/1994 | Revelli, Jr. et al. | |
| 5,355,357 A | 10/1994 | Yamamori et al. | |
| 5,358,601 A | 10/1994 | Cathey | |
| 5,365,283 A | 11/1994 | Doherty et al. | |
| 5,381,232 A | 1/1995 | van Wijk | |
| 5,381,253 A | 1/1995 | Sharp et al. | |
| 5,401,983 A | 3/1995 | Jokerst et al. | |
| 5,411,769 A | 5/1995 | Hornbeck | |
| 5,444,566 A | 8/1995 | Gale et al. | |
| 5,446,479 A | 8/1995 | Thompson et al. | |
| 5,448,314 A | 9/1995 | Heimbuch et al. | |
| 5,452,024 A | 9/1995 | Sampsell | |
| 5,454,906 A | 10/1995 | Baker et al. | |
| 5,457,493 A | 10/1995 | Leddy et al. | |
| 5,457,566 A | 10/1995 | Sampsell et al. | |
| 5,459,602 A | 10/1995 | Sampsell | |
| 5,459,610 A | 10/1995 | Bloom et al. | |
| 5,461,411 A | 10/1995 | Florence et al. | |
| 5,472,370 A * | 12/1995 | Malshe et al. | 451/41 |
| 5,474,865 A | 12/1995 | Vasudev | |
| 5,489,952 A | 2/1996 | Gove et al. | |
| 5,497,172 A | 3/1996 | Doherty et al. | |
| 5,497,197 A | 3/1996 | Gove et al. | |
| 5,497,262 A * | 3/1996 | Kaeriyama | 359/223 |
| 5,499,037 A | 3/1996 | Nakagawa et al. | |
| 5,499,062 A | 3/1996 | Urbanus | |
| 5,500,635 A | 3/1996 | Mott | |
| 5,500,761 A | 3/1996 | Goossen et al. | |
| 5,503,952 A | 4/1996 | Suzuki et al. | |
| 5,506,597 A | 4/1996 | Thompson et al. | |
| 5,515,076 A | 5/1996 | Thompson et al. | |
| 5,517,347 A | 5/1996 | Sampsell | |
| 5,523,803 A | 6/1996 | Urbanus et al. | |
| 5,526,051 A | 6/1996 | Gove et al. | |
| 5,526,172 A | 6/1996 | Kanack | |
| 5,526,327 A | 6/1996 | Cordova, Jr. | |
| 5,526,688 A | 6/1996 | Boysel et al. | |
| 5,535,047 A | 7/1996 | Hornbeck | |
| 5,548,301 A | 8/1996 | Kornher et al. | |
| 5,551,293 A | 9/1996 | Boysel et al. | |
| 5,552,924 A | 9/1996 | Tregilgas | |
| 5,552,925 A | 9/1996 | Worley | |
| 5,559,358 A | 9/1996 | Burns et al. | |
| 5,563,398 A | 10/1996 | Sampsell | |
| 5,567,334 A | 10/1996 | Baker et al. | |
| 5,570,135 A | 10/1996 | Gove et al. | |
| 5,579,149 A | 11/1996 | Moret et al. | |
| 5,581,272 A | 12/1996 | Conner et al. | |
| 5,583,688 A | 12/1996 | Hornbeck | |
| 5,589,852 A | 12/1996 | Thompson et al. | |
| 5,597,736 A | 1/1997 | Sampsell | |
| 5,600,383 A | 2/1997 | Hornbeck | |
| 5,602,671 A | 2/1997 | Hornbeck | |
| 5,606,441 A | 2/1997 | Florence et al. | |
| 5,608,468 A | 3/1997 | Gove et al. | |
| 5,610,438 A | 3/1997 | Wallace et al. | |
| 5,610,624 A | 3/1997 | Bhuva | |
| 5,610,625 A | 3/1997 | Sampsell | |
| 5,619,059 A | 4/1997 | Li et al. | |

| Patent | Date | Inventor |
|---|---|---|
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A * | 7/1997 | Kaeriyama .................. 359/224 |
| 5,647,819 A | 7/1997 | Fujita et al. |
| 5,650,834 A | 7/1997 | Nakagawa et al. |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,661,591 A | 8/1997 | Lin et al. |
| 5,665,997 A | 9/1997 | Weaver et al. |
| 5,673,139 A | 9/1997 | Johnson |
| 5,673,785 A | 10/1997 | Schlaak et al. |
| 5,674,757 A | 10/1997 | Kim |
| 5,683,591 A | 11/1997 | Offenberg |
| 5,703,710 A | 12/1997 | Brinkman et al. |
| 5,706,022 A | 1/1998 | Hato |
| 5,710,656 A | 1/1998 | Goossen |
| 5,726,480 A | 3/1998 | Pister |
| 5,739,945 A | 4/1998 | Tayebati |
| 5,740,150 A | 4/1998 | Uchimaru et al. |
| 5,745,193 A | 4/1998 | Urbanus et al. |
| 5,745,281 A | 4/1998 | Yi et al. |
| 5,751,469 A | 5/1998 | Arney et al. |
| 5,771,116 A | 6/1998 | Miller et al. |
| 5,771,321 A | 6/1998 | Stern |
| 5,784,190 A | 7/1998 | Worley |
| 5,784,212 A | 7/1998 | Hornbeck |
| 5,786,927 A | 7/1998 | Greywall |
| 5,793,504 A | 8/1998 | Stoll |
| 5,808,780 A | 9/1998 | McDonald |
| 5,808,781 A | 9/1998 | Arney et al. |
| 5,818,095 A | 10/1998 | Sampsell |
| 5,822,170 A | 10/1998 | Cabuz et al. |
| 5,824,608 A | 10/1998 | Gotoh et al. |
| 5,825,528 A | 10/1998 | Goossen |
| 5,835,255 A | 11/1998 | Miles |
| 5,838,484 A | 11/1998 | Goosen et al. |
| 5,842,088 A | 11/1998 | Thompson |
| 5,867,302 A | 2/1999 | Fleming et al. |
| 5,912,758 A | 6/1999 | Knipe et al. |
| 5,926,309 A | 7/1999 | Little |
| 5,943,158 A | 8/1999 | Ford et al. |
| 5,959,763 A | 9/1999 | Bozler et al. |
| 5,972,193 A | 10/1999 | Chou et al. |
| 5,976,902 A | 11/1999 | Shih |
| 5,986,796 A | 11/1999 | Miles |
| 6,016,693 A | 1/2000 | Viani et al. |
| 6,028,690 A | 2/2000 | Carter et al. |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,057,903 A | 5/2000 | Colgan et al. |
| 6,061,075 A | 5/2000 | Nelson et al. |
| 6,099,132 A | 8/2000 | Kaeriyama |
| 6,100,872 A | 8/2000 | Aratani et al. |
| 6,113,239 A | 9/2000 | Sampsell et al. |
| 6,115,326 A | 9/2000 | Puma et al. |
| 6,147,790 A | 11/2000 | Meier et al. |
| 6,149,190 A | 11/2000 | Galvin et al. |
| 6,158,156 A | 12/2000 | Patrick |
| 6,160,833 A | 12/2000 | Floyd et al. |
| 6,166,422 A | 12/2000 | Qian et al. |
| 6,172,797 B1 | 1/2001 | Huibers |
| 6,180,428 B1 | 1/2001 | Peeters et al. |
| 6,194,323 B1 | 2/2001 | Downey et al. |
| 6,195,196 B1 | 2/2001 | Kimura et al. |
| 6,201,633 B1 | 3/2001 | Peeters et al. |
| 6,204,080 B1 | 3/2001 | Hwang |
| 6,215,221 B1 | 4/2001 | Cabuz et al. |
| 6,229,683 B1 | 5/2001 | Goodwin-Johansson |
| 6,232,936 B1 | 5/2001 | Gove et al. |
| 6,243,149 B1 | 6/2001 | Swanson et al. |
| 6,246,398 B1 | 6/2001 | Koo |
| 6,249,039 B1 | 6/2001 | Harvey et al. |
| 6,282,010 B1 | 8/2001 | Sulzbach et al. |
| 6,284,560 B1 | 9/2001 | Jech et al. |
| 6,288,472 B1 | 9/2001 | Cabuz et al. |
| 6,288,824 B1 | 9/2001 | Kastalsky et al. |
| 6,295,154 B1 | 9/2001 | Laor et al. |
| 6,323,982 B1 | 11/2001 | Hornbeck |
| 6,327,071 B1 | 12/2001 | Kimura et al. |
| 6,329,297 B1 | 12/2001 | Balish et al. |
| 6,335,831 B2 | 1/2002 | Kowarz et al. |
| 6,351,329 B1 | 2/2002 | Greywall |
| 6,356,254 B1 | 3/2002 | Kimura |
| 6,358,021 B1 | 3/2002 | Cabuz |
| 6,376,787 B1 | 4/2002 | Martin et al. |
| 6,391,675 B1 | 5/2002 | Ehmke et al. |
| 6,392,233 B1 | 5/2002 | Channin et al. |
| 6,392,781 B1 | 5/2002 | Kim et al. |
| 6,407,851 B1 | 6/2002 | Islam et al. |
| 6,433,917 B1 | 8/2002 | Mei et al. |
| 6,446,486 B1 | 9/2002 | deBoer et al. |
| 6,447,126 B1 | 9/2002 | Hornbeck |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,354 B1 | 10/2002 | Gudeman |
| 6,466,358 B2 | 10/2002 | Tew |
| 6,473,274 B1 | 10/2002 | Maimone et al. |
| 6,480,177 B2 | 11/2002 | Doherty et al. |
| 6,496,122 B2 | 12/2002 | Sampsell |
| 6,513,911 B1 | 2/2003 | Ozaki et al. |
| 6,522,801 B1 | 2/2003 | Aksyuk et al. |
| 6,531,945 B1 | 3/2003 | Ahn et al. |
| 6,537,427 B1 | 3/2003 | Raina et al. |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,577,785 B1 | 6/2003 | Spahn et al. |
| 6,589,625 B1 | 7/2003 | Kothari et al. |
| 6,600,201 B2 | 7/2003 | Hartwell et al. |
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,618,187 B2 | 9/2003 | Pilossof |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,642,913 B1 | 11/2003 | Kimura et al. |
| 6,643,069 B2 | 11/2003 | Dewald |
| 6,650,455 B2 | 11/2003 | Miles |
| 6,657,832 B2 | 12/2003 | Williams et al. |
| 6,666,561 B1 | 12/2003 | Blakley |
| 6,674,562 B1 | 1/2004 | Miles et al. |
| 6,674,563 B2 | 1/2004 | Chui et al. |
| 6,680,792 B2 | 1/2004 | Miles |
| 6,687,896 B1 | 2/2004 | Royce et al. |
| 6,710,908 B2 | 3/2004 | Miles et al. |
| 6,720,267 B1 | 4/2004 | Chen et al. |
| 6,736,987 B1 | 5/2004 | Cho |
| 6,741,377 B2 | 5/2004 | Miles |
| 6,741,383 B2 | 5/2004 | Huibers et al. |

| | | |
|---|---|---|
| 6,741,384 B1 | 5/2004 | Martin et al. |
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,794,119 B2 | 9/2004 | Miles |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,912,022 B2 | 6/2005 | Lin et al. |
| 6,952,303 B2 | 10/2005 | Lin et al. |
| 6,952,304 B2 | 10/2005 | Mushika et al. |
| 6,958,847 B2 | 10/2005 | Lin |
| 6,967,757 B1 | 11/2005 | Allen et al. |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,006,272 B2 | 2/2006 | Tsai |
| 7,053,737 B2 | 5/2006 | Schwartz et al. |
| 7,075,700 B2 | 7/2006 | Muenter |
| 7,110,158 B2 | 9/2006 | Miles |
| 7,123,216 B1 | 10/2006 | Miles |
| 7,161,728 B2 * | 1/2007 | Sampsell et al. ............ 359/291 |
| 7,198,973 B2 | 4/2007 | Lin et al. |
| 7,233,029 B2 * | 6/2007 | Mochizuki ................... 257/98 |
| 2001/0003487 A1 | 6/2001 | Miles |
| 2001/0026951 A1 | 10/2001 | Vergani et al. |
| 2001/0028503 A1 | 10/2001 | Flanders et al. |
| 2001/0040649 A1 | 11/2001 | Ozaki |
| 2001/0040675 A1 | 11/2001 | True et al. |
| 2002/0015215 A1 | 2/2002 | Miles |
| 2002/0021485 A1 | 2/2002 | Pilossof |
| 2002/0024711 A1 | 2/2002 | Miles |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0126364 A1 | 9/2002 | Miles |
| 2002/0131682 A1 | 9/2002 | Nasiri et al. |
| 2002/0135857 A1 | 9/2002 | Fitzpatrick et al. |
| 2002/0137072 A1 | 9/2002 | Mirkin et al. |
| 2002/0149828 A1 | 10/2002 | Miles |
| 2002/0168136 A1 | 11/2002 | Atia et al. |
| 2003/0006468 A1 | 1/2003 | Ma et al. |
| 2003/0015936 A1 | 1/2003 | Yoon et al. |
| 2003/0016428 A1 | 1/2003 | Kato et al. |
| 2003/0029705 A1 | 2/2003 | Qiu et al. |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0123126 A1 | 7/2003 | Meyer et al. |
| 2003/0138213 A1 | 7/2003 | Jiin et al. |
| 2003/0152872 A1 | 8/2003 | Miles |
| 2003/0156315 A1 | 8/2003 | Li et al. |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2003/0231373 A1 | 12/2003 | Kowarz et al. |
| 2004/0008396 A1 | 1/2004 | Stappaerts |
| 2004/0008438 A1 | 1/2004 | Sato |
| 2004/0010115 A1 | 1/2004 | Sotzing |
| 2004/0027636 A1 | 2/2004 | Miles |
| 2004/0027671 A1 | 2/2004 | Wu et al. |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0051929 A1 | 3/2004 | Sampsell et al. |
| 2004/0053434 A1 | 3/2004 | Bruner |
| 2004/0056742 A1 | 3/2004 | Dabbaj |
| 2004/0058532 A1 | 3/2004 | Miles et al. |
| 2004/0061543 A1 | 4/2004 | Nam et al. |
| 2004/0063322 A1 | 4/2004 | Yang |
| 2004/0070813 A1 | 4/2004 | Aubuchon |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125347 A1 | 7/2004 | Patel et al. |
| 2004/0125536 A1 | 7/2004 | Arney et al. |
| 2004/0136045 A1 | 7/2004 | Tran |
| 2004/0136076 A1 | 7/2004 | Tayebati |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0207497 A1 | 10/2004 | Hsu et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Piehl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0233498 A1 | 11/2004 | Starkweather et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |

| | | |
|---|---|---|
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0168849 A1 | 8/2005 | Lin |
| 2005/0195462 A1 | 9/2005 | Lin |
| 2005/0195464 A1 | 9/2005 | Faase et al. |
| 2005/0195467 A1 | 9/2005 | Kothari et al. |
| 2005/0202649 A1 | 9/2005 | Hung et al. |
| 2006/0024880 A1 | 2/2006 | Chui et al. |
| 2006/0066932 A1 | 3/2006 | Chui |
| 2006/0066935 A1 | 3/2006 | Cummings et al. |
| 2008/0026328 A1 | 1/2008 | Miles |

FOREIGN PATENT DOCUMENTS

| | | |
|---|---|---|
| CN | 092109265 | 11/2003 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 A | 2/1996 |
| EP | 0 788 005 | 8/1997 |
| EP | 0878824 A2 | 11/1998 |
| EP | 1197778 A | 4/2002 |
| EP | 1258860 A1 | 11/2002 |
| EP | 1 275 997 | 1/2003 |
| EP | 1 452 481 A | 9/2004 |
| FR | 2824643 | 10/1999 |
| JP | 405275401 A | 10/1993 |
| JP | 9-127439 | 5/1997 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002-062490 | 2/2002 |
| JP | 2002 062493 | 2/2002 |
| JP | 2002-270575 | 9/2002 |
| JP | 2002-277771 | 9/2002 |
| JP | 2002-355800 | 12/2002 |
| JP | 2003001598 A | 1/2003 |
| JP | 2003195201 | 7/2003 |
| JP | 2004-102022 A | 4/2004 |
| JP | 2004106074 A | 4/2004 |
| JP | 2004157527 | 6/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO2006/036542 | 4/2002 |
| WO | WO 02/079853 | 10/2002 |
| WO | WO03007049 A1 | 1/2003 |
| WO | WO 03/014789 | 2/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2005/019899 A1 | 3/2005 |
| WO | WO 2005/085932 A | 9/2005 |
| WO | WO 2006/036385 | 4/2006 |
| WO | WO 2006/036437 | 4/2006 |

OTHER PUBLICATIONS

Akasaka, "Three-Dimensional IC Trends," Proceedings of IEEE, vol. 74, No. 12, pp. 1703-1714, (Dec. 1986).
Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1 Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. (1996).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing for General-Purpose," IEEE, 0-8186-8900-, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

PCT/US02/13442, Search Report Sep. 13, 2002.

PCT/US04/20330 Search Report Nov. 8, 2004.

PCT/US05/029821 International Search Report (Dec. 27, 2005).

PCT/US05/030927 International Search Report (Jan. 25, 2006).

PCT/US05/031693 International Search Report.

PCT/US05/032331 International Search Report (Apr. 7, 2006).

PCT/US05/033558 Partial International Search Report (Feb. 24, 2006).

PCT/US2004/035820 International Search Report and Written Opinion (Apr. 11, 2005).

PCT/US96/17731 Search Report.

Raley et al., "A Fabry-Perot Microinterferometer for Visible Wavelengths," IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Aratani et al., "Process and Design Considerations for Surface Micromachined Beams for a Tuneable Interferometer Array in Silicon," Proc. IEEE Microelectromechanical Workshop, Fort Lauderdale, FL; pp. 230-235 (Feb. 1993).

Austrian Search Report for EX72/2005 dated May 13, 2005.

Austrian Search Report for EX81/2005 dated May 18, 2005.

Austrian Search Report for EX170/2005 dated Jul. 6, 2005.

Austrian Search Report for EX139/2005 dated Jul. 27, 2005.

Austrian Search Report for EX144/2005 dated Aug. 11, 2005.

Bains, "Digital Paper Display Technology Holds Promise For Portables," CommsDesign EE Times (2000).

Bass, Handbook of Optics, vol. 1, Fundamentals, Techniques, and Design, Second Edition, McGraw-Hill, inc. New York pp. 2.29-2.36 (1995).

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 (Jun. 1996) IOP Publishing.

Furneaux, et al. "The Formation of Controlled-porosity membranes from Anodically Oxidized Aluminium" Nature vo 337 Jan. 12, 1989, pp. 147-149.

Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http://www.pentavacuum.com/memes.htm.

Science and Technology, The Economist, pp. 89-90, (May 1999).

Search Report PCT/US05/031237 (Dec. 29, 2005).

Search Report PCT/US05/030033 and Written Opinion.

Search Report PCT/US05/030902.

Search Report and Written Opinion for PCT/US05/33558 (May 19, 2005).

Search Report PCT/US05/032331 (Apr. 7, 2006).

Search Report PCT/US05/032331 (Jan. 9, 2006).

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Thin Film Transistors- Materials and Processes -Vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product information.

IPRP for PCT/US05/032647 filed Sep. 15, 2005.

Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.

Official Communication dated Apr. 14, 2009 in European App. No. 05795184.0.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

MEMS USING FILLER MATERIAL AND METHOD

CROSS REFERENCE TO RELATED APPLICATION

This application claims the benefit of U.S. Application No. 60/613,475, filed Sep. 27, 2004, the disclosure of which is incorporated by reference.

BACKGROUND

1. Field of the Invention

This application is generally related to microelectromechanical systems devices, and more particularly, to optical modulators.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

Described herein is an apparatus, method for manufacturing, and systems comprising a MEMS device, for example, an interferometric optical modulator, comprising a substrate, a movable mirror, a deformable layer, and a support structure. In some embodiments, the support structure comprises a plurality of support posts. A connector secures the movable mirror to the deformable layer. At least one of the connector and the support post is a composite comprising a first component and a second component, where at the first component forms at least a portion of the perimeter of at least one of the connector and support post.

Accordingly, one embodiment described herein provides a microelectromechanical systems device comprising: a substrate; a deformable layer; a support structure supporting the deformable layer; a movable conductor positioned between the substrate and the deformable layer; and at least one connector securing the movable conductor to the deformable layer. At least one of the connector and the support structure comprises a first component and a second component, at least a portion of the first component is disposed on the perimeter of at least one of the connector and the support structure; and the first component comprises a non-electrically conductive filler material.

Another embodiment provides a method for fabricating an optical modulator and an optical modulator fabricated thereby, the method comprising: forming over a substrate, a layer of a first sacrificial material, a mirror, and a layer of a second sacrificial material; forming a first opening through the layer of the second sacrificial material thereby exposing the mirror; and filling at least a portion of the sides of the opening with a filler material.

Another embodiment provides a microelectromechanical systems device comprising: a deformable conductive layer; a movable conductive layer; an electrically conductive core extending between the deformable conductive layer and the movable conductive layer; and a layer of a non-electrically conductive material surrounding the conductive core.

Another embodiment provides a microelectromechanical systems device comprising: a substrate; a layer of a first sacrificial material formed over the substrate; a conductor formed over the layer of the first sacrificial material; a layer of a second sacrificial material formed over the conductor; a first opening through the layer of the second sacrificial material, wherein the first opening exposes the conductor; and a means for filling discontinuities in first opening with a filler material. Some embodiments further comprise: a deformable layer formed over the layer of the second sacrificial material; and a plurality of posts extending between the substrate and the deformable layer.

Another embodiment provides a microelectromechanical systems device comprising: a movable conductor; a means for supporting the movable conductor; a means for communicating electrical signals between the movable conductor and the means for supporting the movable conducto; and a means for facilitating formation of the means for communicating electrical signals.

BRIEF DESCRIPTION OF THE DRAWINGS

These and other aspects of the invention will be readily apparent from the following description and from the appended drawings (not to scale), which are meant to illustrate and not to limit the invention.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments of the MEMS device disclosed herein comprise a composite connector securing the movable mirror to the deformable layer. The composite connector comprises a first component and a second component, wherein the first component comprises a filler material. In some embodiments, at least a portion of the first component of the connector is disposed on the perimeter of the connector. In some embodiments, the first component forms the sides of at least a portion of the connector, for example, a collar around the lower portion of the connector. In other embodiments, the first component is annular, forming the entire sides of the connector and completely surrounding the sides' second component. Embodiments of the device also comprise composite support posts. The composite support posts comprise a first component and a second component, wherein the first component comprises a filler material. In some embodiments, at least a portion of the first component is disposed on the perimeter of the support post. Embodiments of the disclosed device are more easily fabricated than similar devices using non-composite connectors. For example, in some embodiments, the filler material is applied in a spin-on process. In some embodiments, the filler material provides a surface on the device upon which a layer of a predetermined material is more easily formed than on an equivalent device without the filler material.

Figure 1:
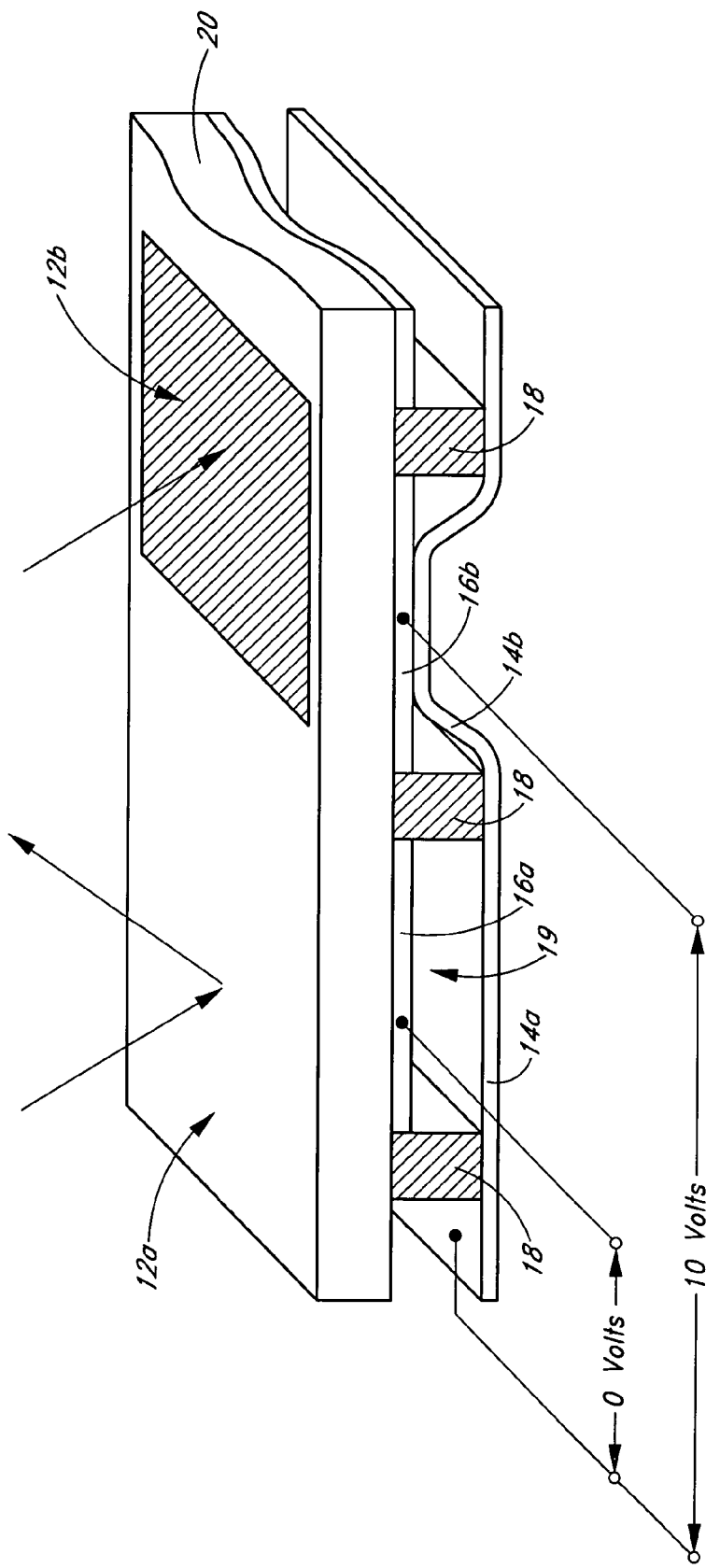
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIG. 2 through FIG. 5 illustrate one exemplary process and system for using an array of interferometric modulators in a display application.

Figure 2:
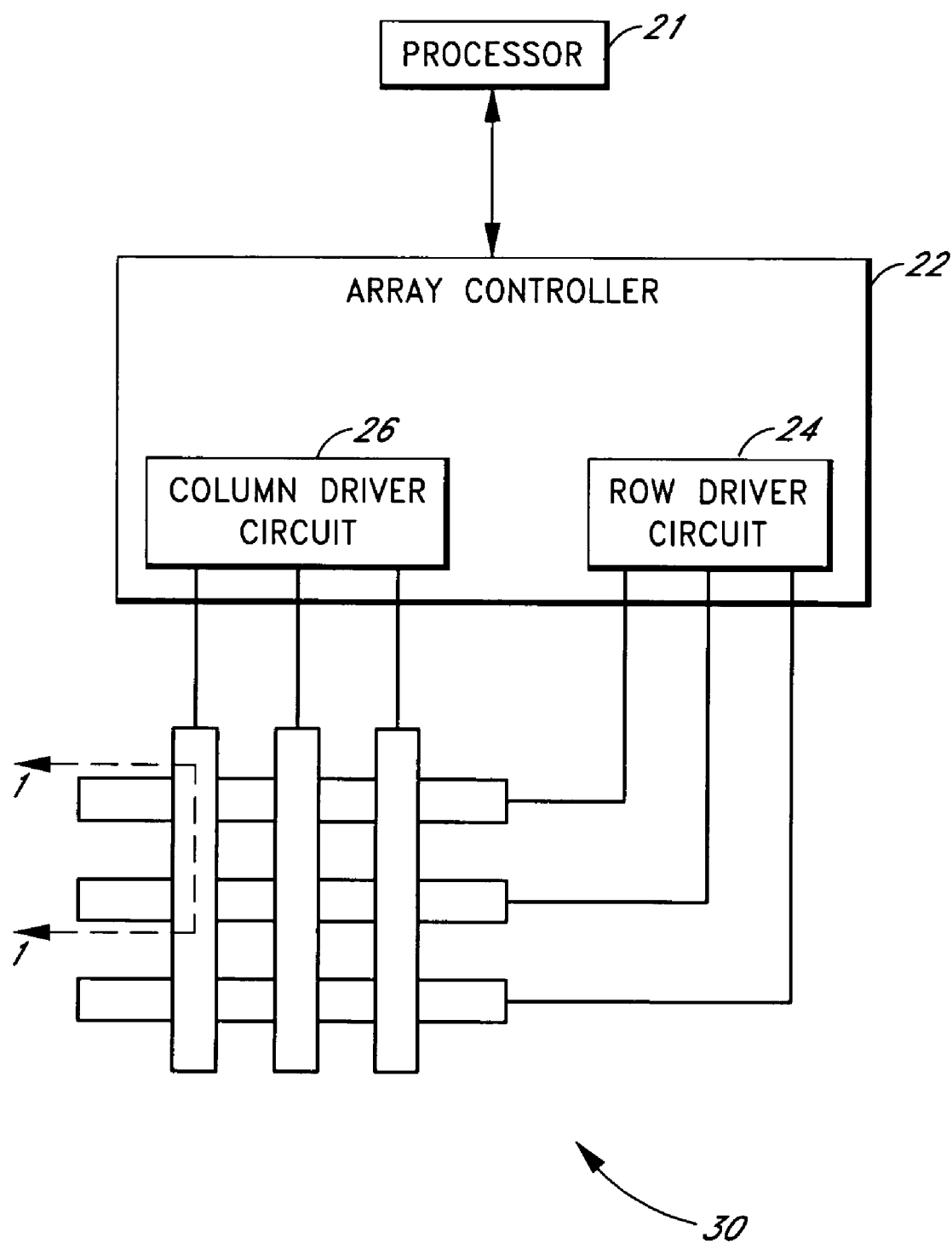
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
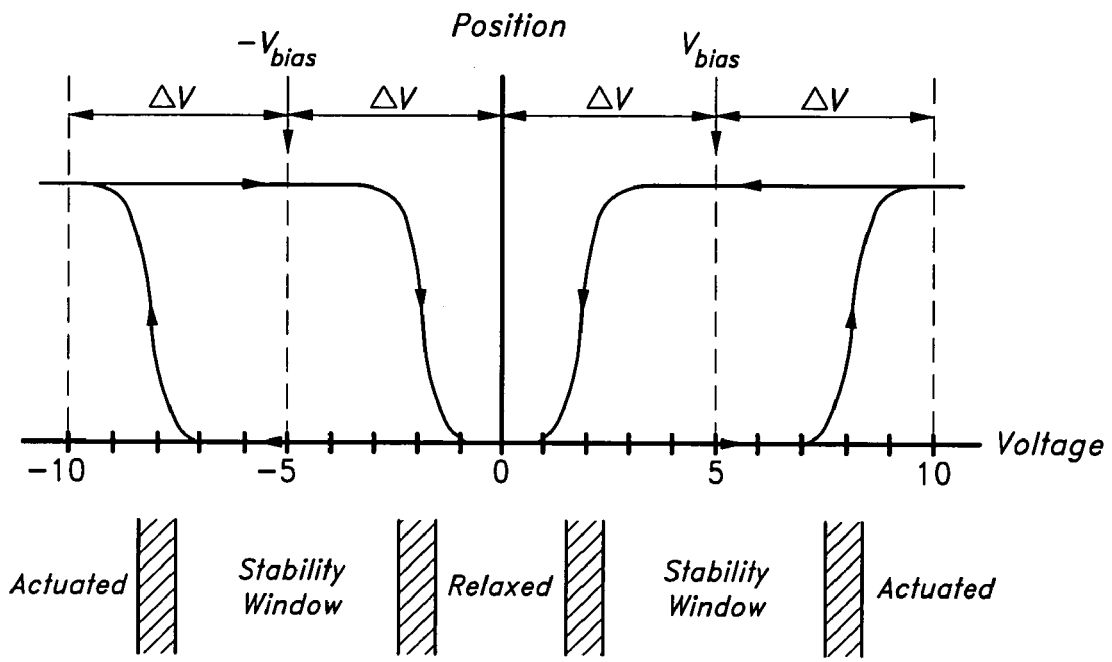
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 4 and FIG. 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
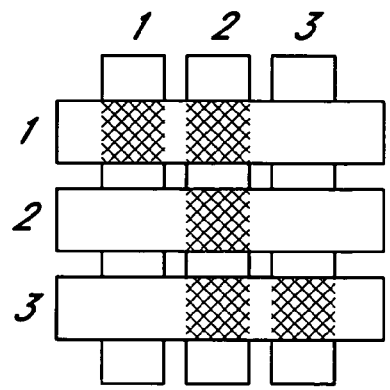
FIG. 5A and FIG. 5B illustrate one exemplary timing diagram for row and column signals that may be used to write a frame of display data to the 3×3 interferometric modulator display of FIG. 2.
Figure 5B:
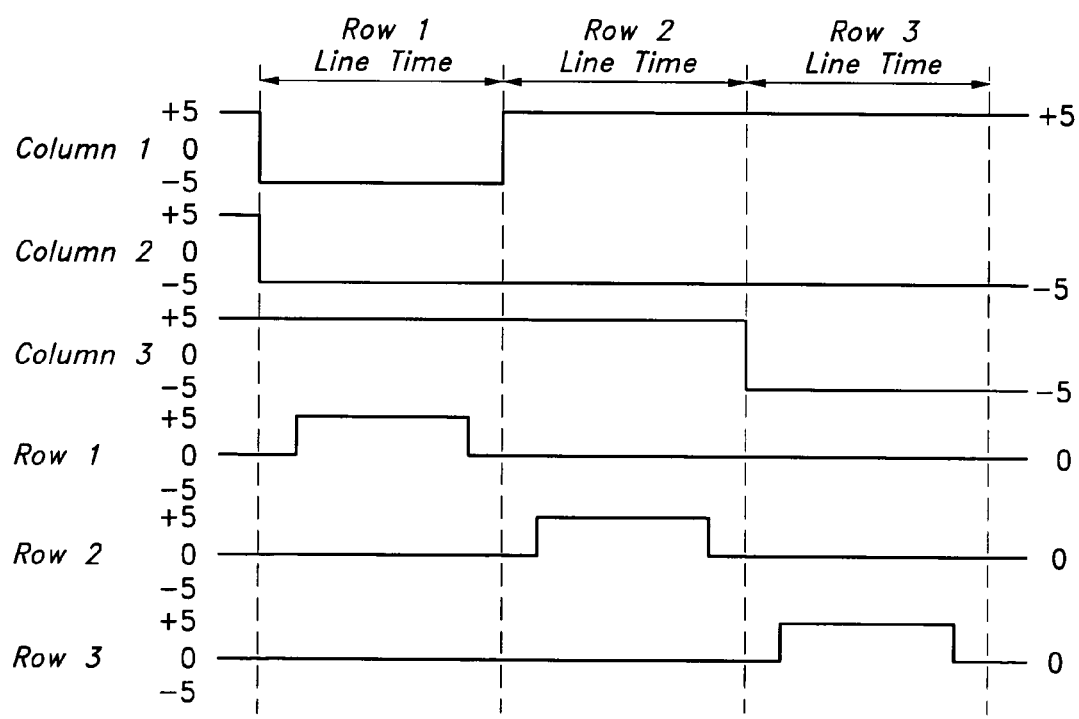

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
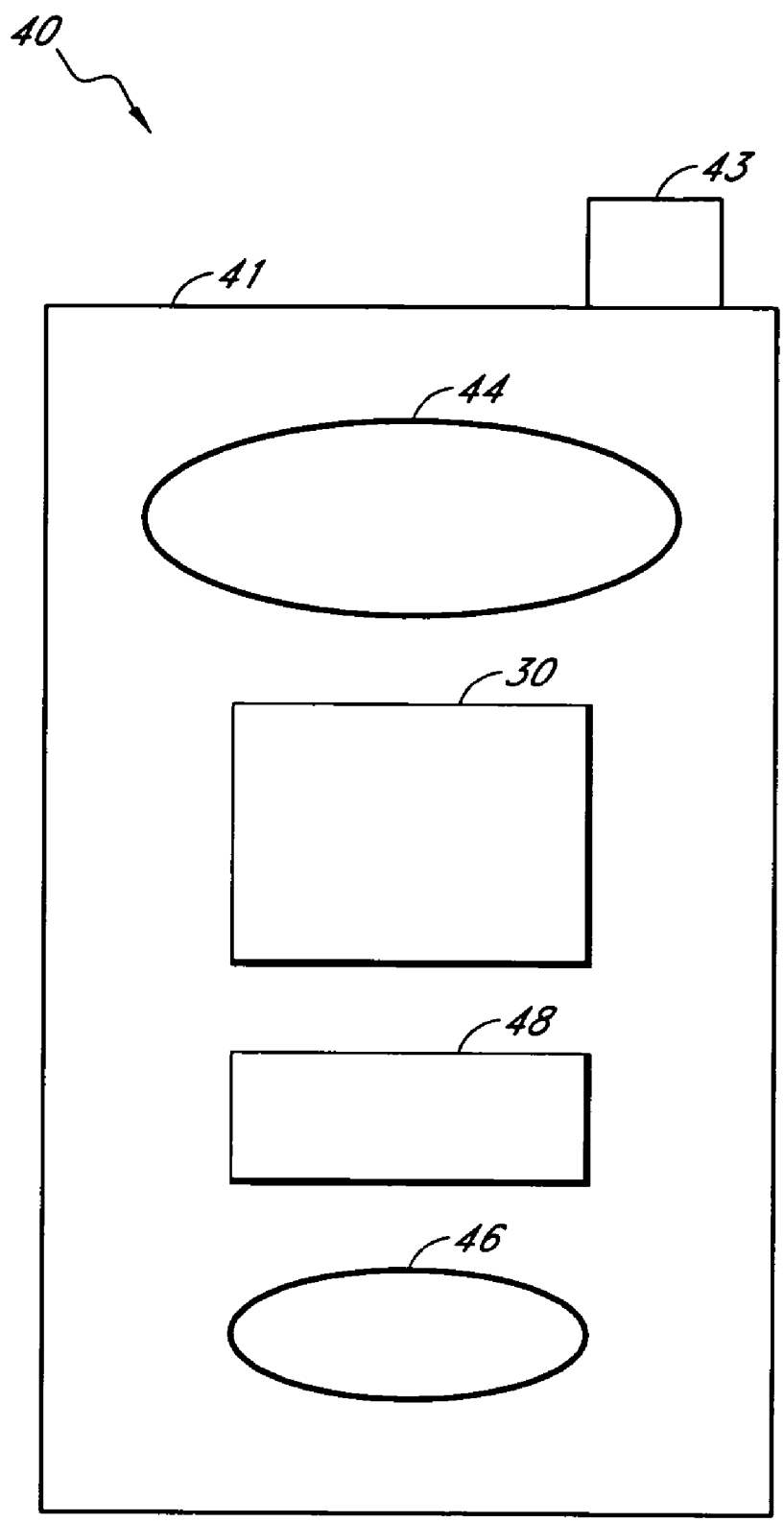
FIG. 6A and FIG. 6B are system block diagrams illustrating an embodiment of a visual display device comprising a plurality of interferometric modulators.
Figure 6B:
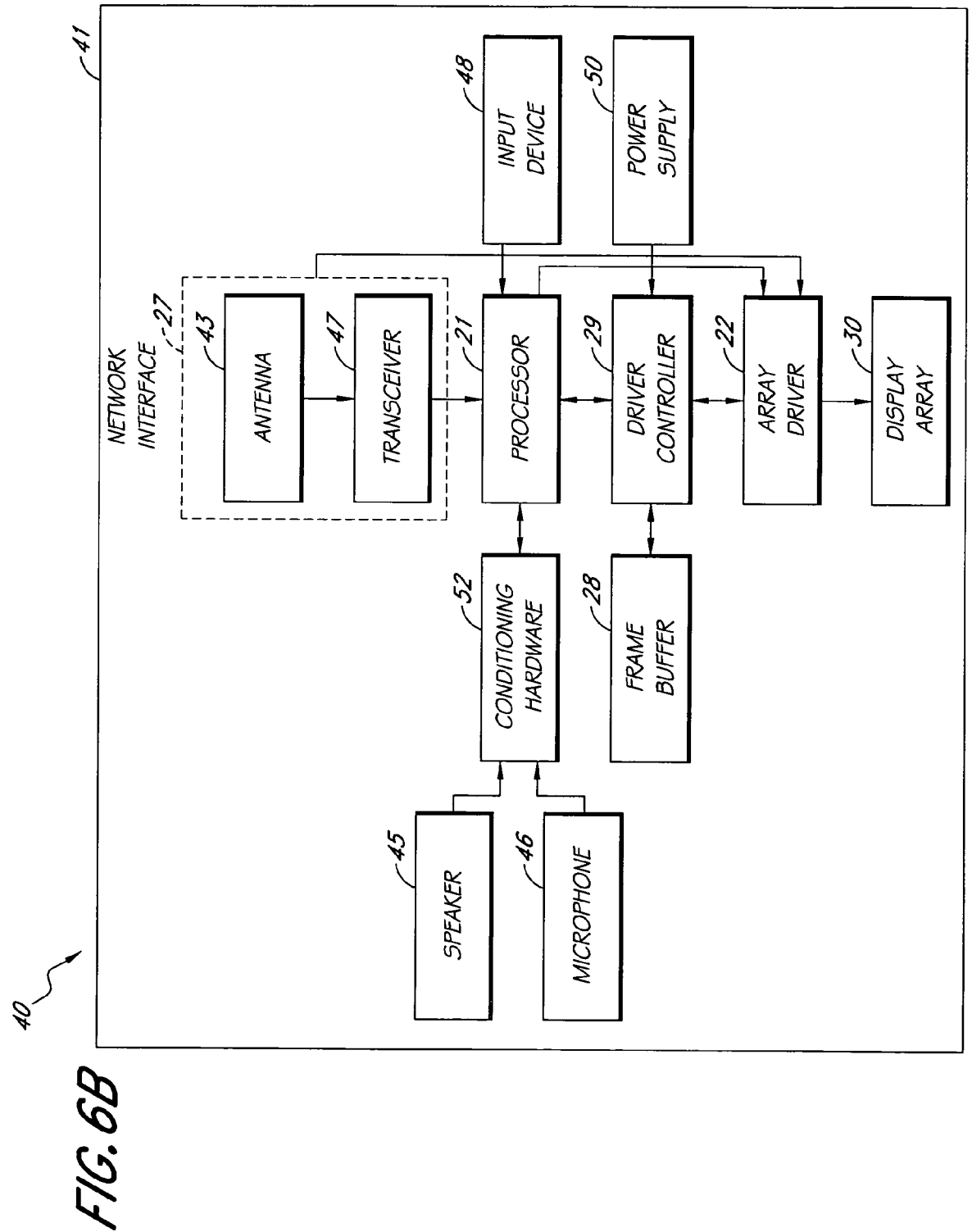

FIG. 6A and FIG. 6B are system block diagrams illustrating an embodiment of a display device 40. The display device 40 can be, for example, a cellular or mobile telephone. However, the same components of the display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
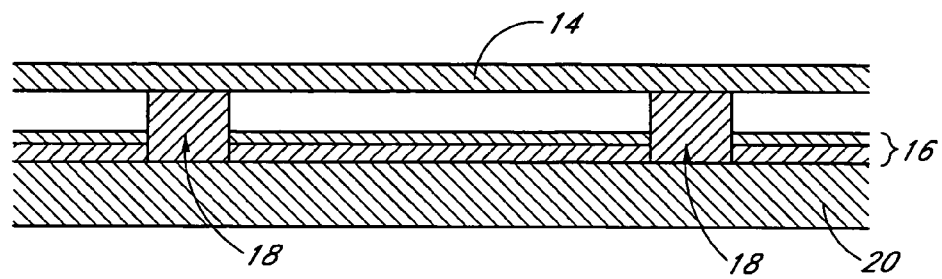
FIG. 7A is a cross section of the device of FIG. 1.
Figure 7B:
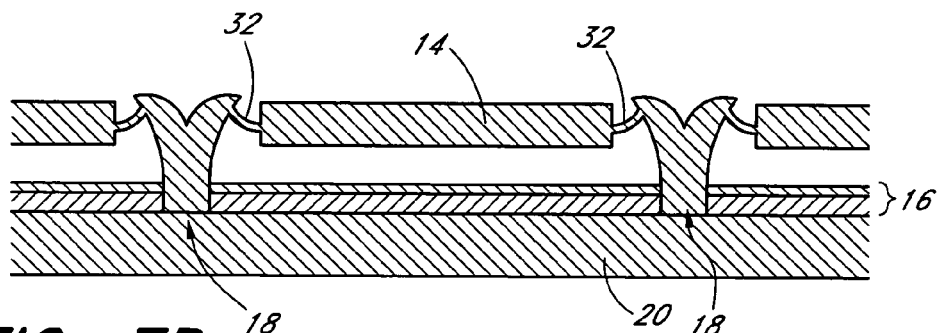
FIG. 7B is a cross section of an alternative embodiment of an interferometric modulator.
Figure 7C:
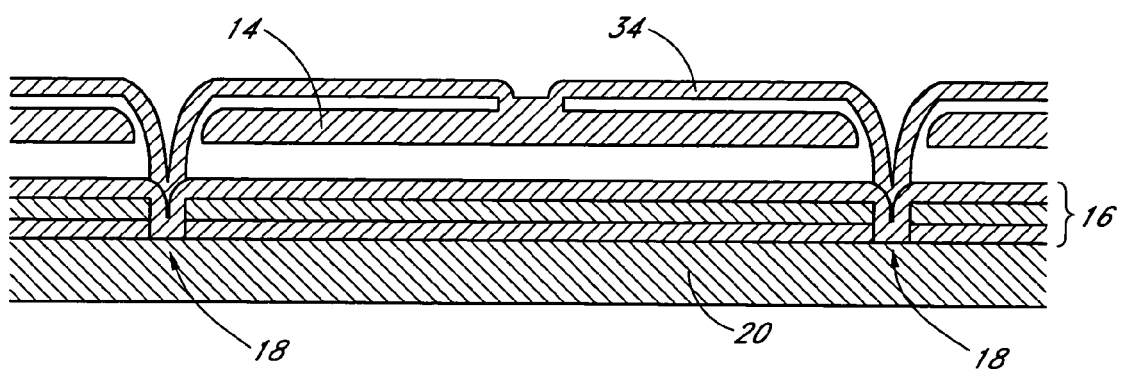
FIG. 7C is a cross section of another alternative embodiment of an interferometric modulator.

The details of the structure of interferometric modulators that operate in accordance with the principles set forth above may vary widely. For example, FIG. 7A-FIG. 7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as the support posts 18. The embodiment illustrated in FIG. 7D has support posts 18 that include support post plugs 42 upon which the deformable layer 34 rests. The movable reflective layer 14 remains suspended over the cavity, as in FIG. 7A-FIG. 7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIG. 7A-FIG. 7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIG. 7C-FIG. 7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The MEMS devices, structures, methods, and systems described below are optical modulators. The teachings herein are also applicable to other types of MEMS devices, as will be apparent to those skilled in the art. Those skilled in the art will also understand that the teachings are also applicable to optical modulators of other types, for example optical modulators as described above and illustrated in FIG. 7A-FIG. 7E.

Figure 7D:
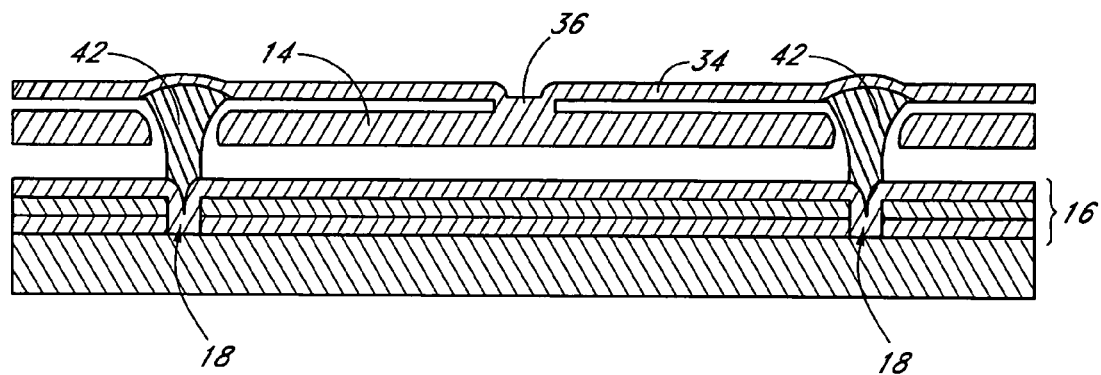
FIG. 7D is a cross section of yet another alternative embodiment of an interferometric modulator.
Figure 7E:
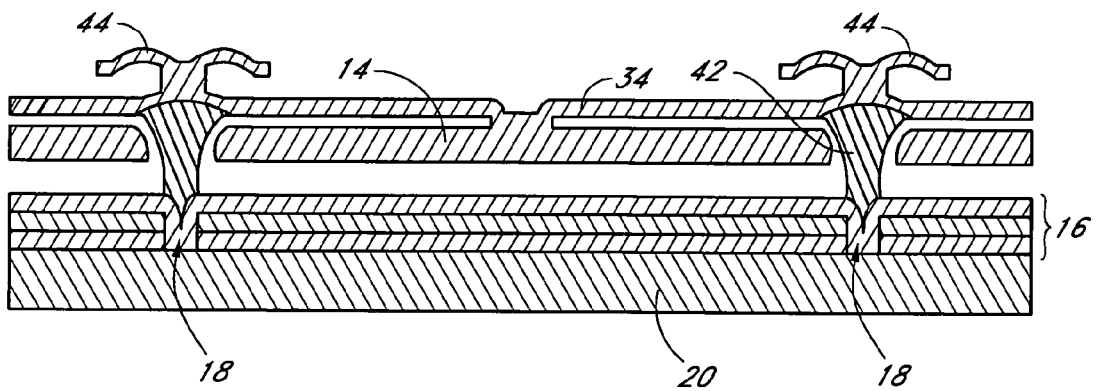
FIG. 7E is a cross section of an additional alternative embodiment of an interferometric modulator.
Figure 8A:
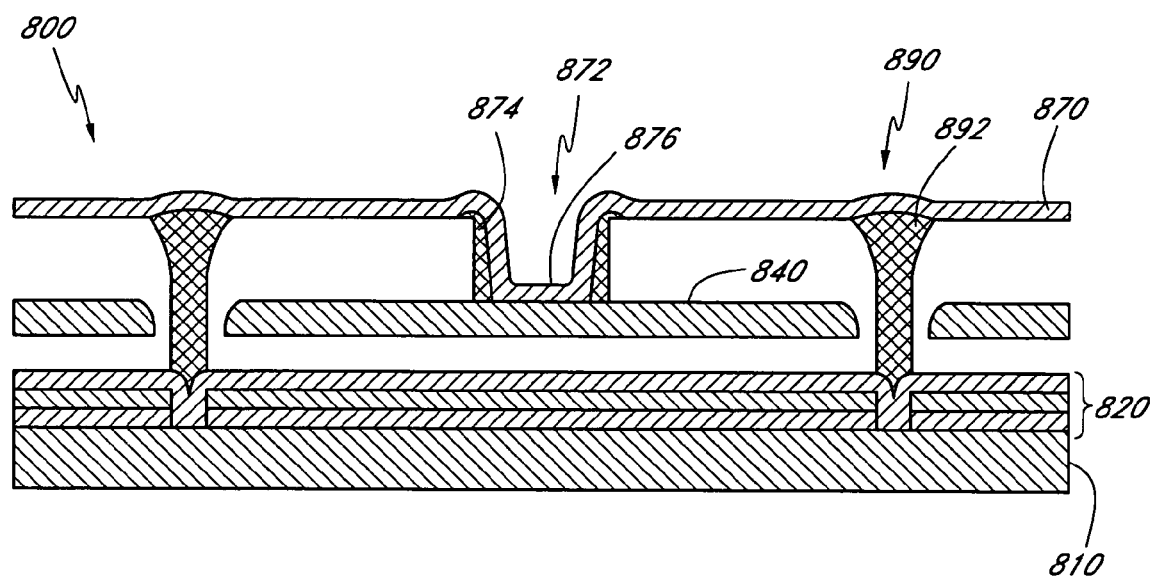
FIG. 8A-FIG. 8E illustrate embodiments of an interferometric modulator comprising a composite connector as disclosed herein.

FIG. 8A illustrates in cross-section an embodiment of an optical modulator 800 similar to the device illustrated in FIG. 7D. The optical modulator 800 comprises a substrate 810, an optical stack 820, a movable mirror 840, a deformable layer 870, and a plurality of support posts 890. The support posts 890 collectively form a support structure. In embodiments in which the MEMS device is not an optical modulator, the optical stack 820 is optional. In some embodiments, at a least a portion of the movable mirror 840 is electrically conductive. Some embodiments in which the MEMS device is not an optical modulator comprise a movable mirror that does not comprise a reflective surface. In these embodiments, the movable mirror is referred to as a "movable conductor." Securing the movable mirror 840 to the deformable layer 870 is a composite connector 872 comprising a first component 874 and a second component 876. In some embodiments, the first component 874 of the connector comprises a filler material and the second part 876 comprises another material. In some preferred embodiments, the filler material is a spin-on and/or self-planarizing material. The filler material is discussed in greater detail below. In some embodiments, at least one of the first component 874 or the second component 876 is electrically conductive. Details on the structure of the composite connector 872 and suitable materials are discussed below. In other embodiments, the optical modulator 800 comprises a plurality of connectors 872. In the illustrated embodiment, the support posts 890 comprise support post plugs 892 comprising a filler material.

Figure 8B:
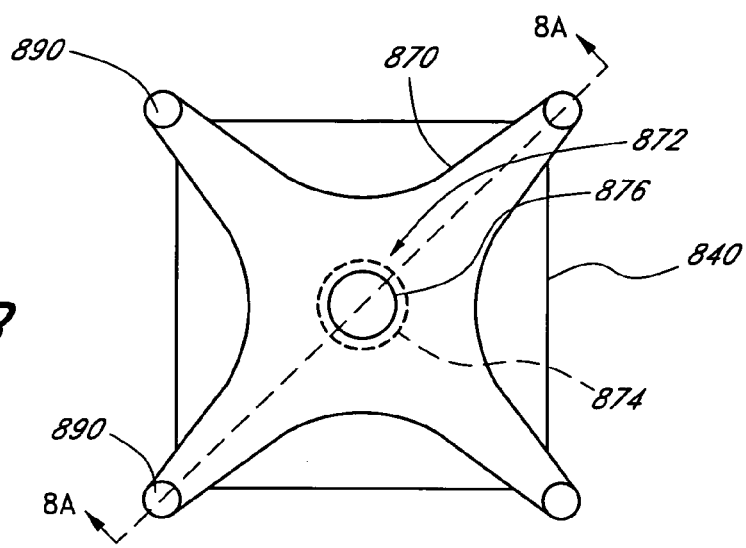
Figure 8C:
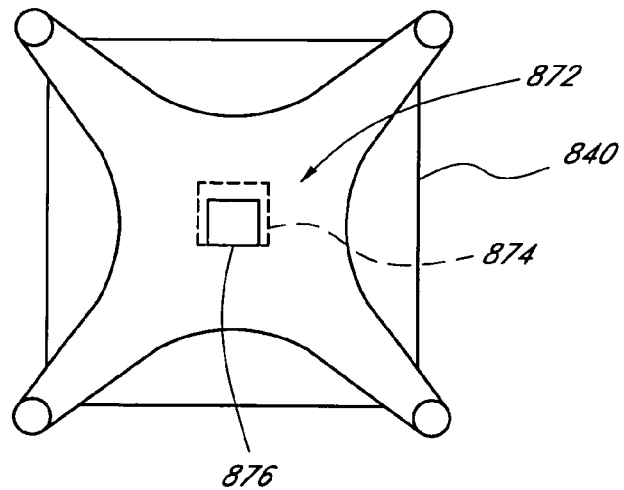
Figure 8D:
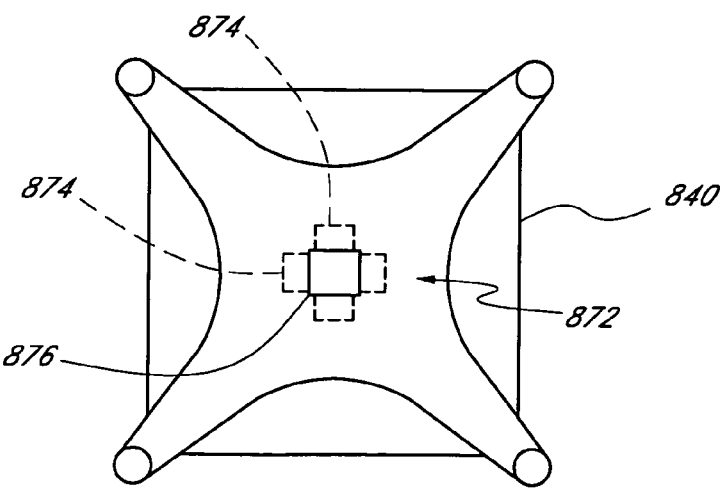
Figure 8E:
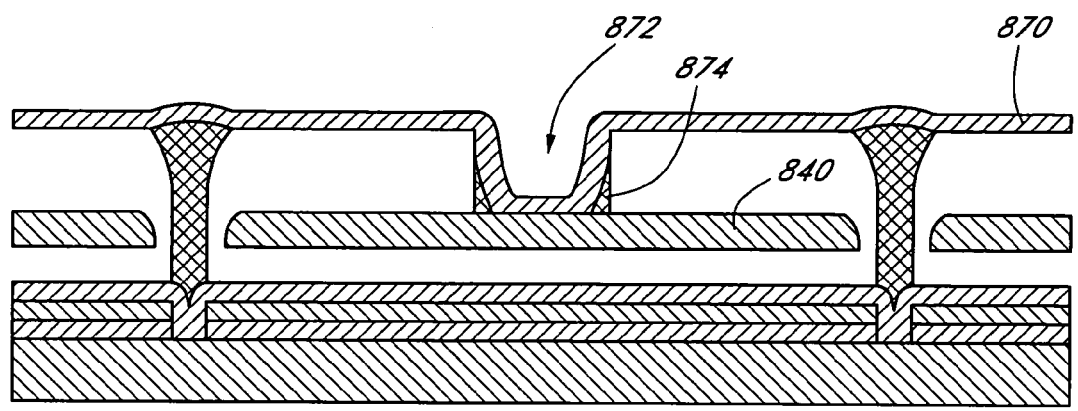

FIG. 8B is a top view of an embodiment of an optical modulator 800. The cross section illustrated in FIG. 8A is indicated by section 8A-8A. FIG. 8B illustrates the deformable layer 870, support posts 890, movable mirror 840 and the composite connector 872. In the illustrated embodiment, the composite connector 872 is substantially circular. In other embodiments, the composite connector 872 has another shape, for example, square, rectangular, hexagonal, elliptical, or other regular and irregular shapes. As discussed above, the composite connector 872 comprises a first component 874 and a second component 876. Returning to FIG. 8A, in the illustrated embodiment, the first component 874 is disposed around the periphery of the composite connector 872. In some embodiments, the first component 874 is shaped like a collar, forming the sides of at least a part of the composite connector 872. For example, in the embodiment illustrated in FIG. 8B, the first component 874 is annular and surrounds at least a portion of the outer sidewall of the second component 876. In other embodiments the first component 874 comprises one or more sections that do not surround or form a complete perimeter around any part of the connector 872, for example, as illustrated in top view in FIG. 8C and FIG. 8D. In the embodiment illustrated in FIG. 8A, the first component 874 forms the entirety of the sides of the connector 872, covering substantially the entire outer sidewall of the second component 876. In other embodiments, the first component 874 does not completely cover the sides of the second component 876. For example, FIG. 8E illustrates a cross section of a connector 872 comprising a first component 874 that forms the sides of the lower portion of the connector 872, but not the sides of the upper portion. In the illustrated embodiment, the first component 874 contacts the mirror 840, but does not extend to the full height of the connector 872.

Returning to FIG. 8A, in the illustrated embodiment, the second component 876 of the composite connector is integrated with the deformable layer 870 and secures the mirror 840 to the deformable layer 870. As illustrated, the second component 876 nests within the first component 874, forming a hollow, concave structure. The bottom of the second component 856 contacts the conductive mirror 840, forming an electrical connection through which electrical signals may be sent to the mirror 840, as described above. Because the second component 856 is integrated with the deformable layer 870 in the illustrated embodiment, both structures comprise the same material. A method for manufacturing the device illustrated in FIG. 8A is described below with reference to FIG. 8F-FIG. 8M. As discussed below, in other embodiments, the second component is not integrated with the deformable layer 870, has a different shape, and/or comprises a material different from the deformable layer 870.

Figure 9A:
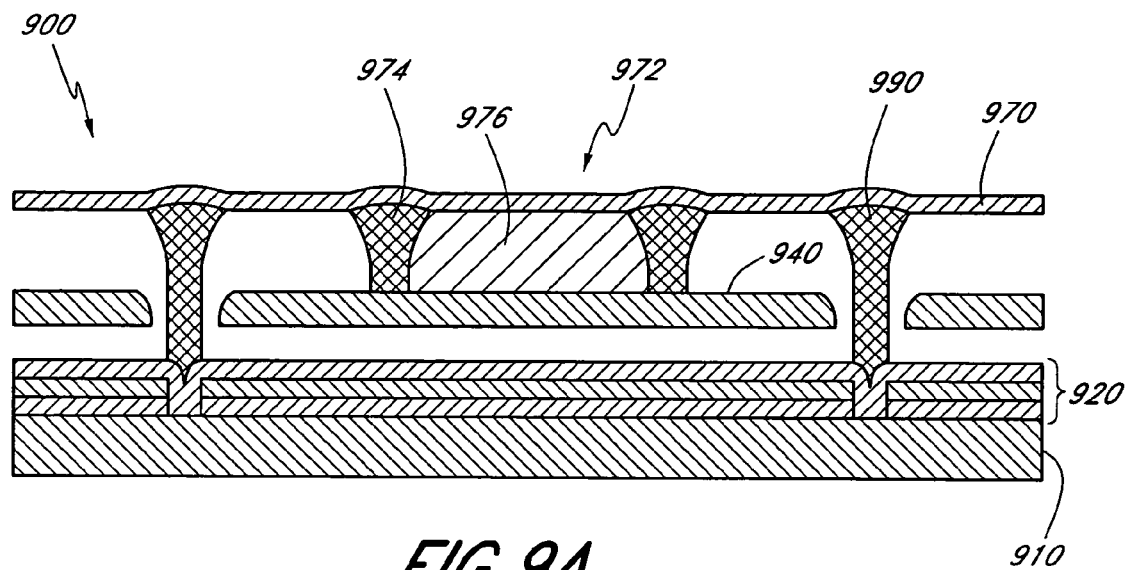
FIG. 9A-FIG. 9F illustrate another embodiment of an interferometric modulator as disclosed herein and intermediate structures in an embodiment of its fabrication.
Figure 9B:
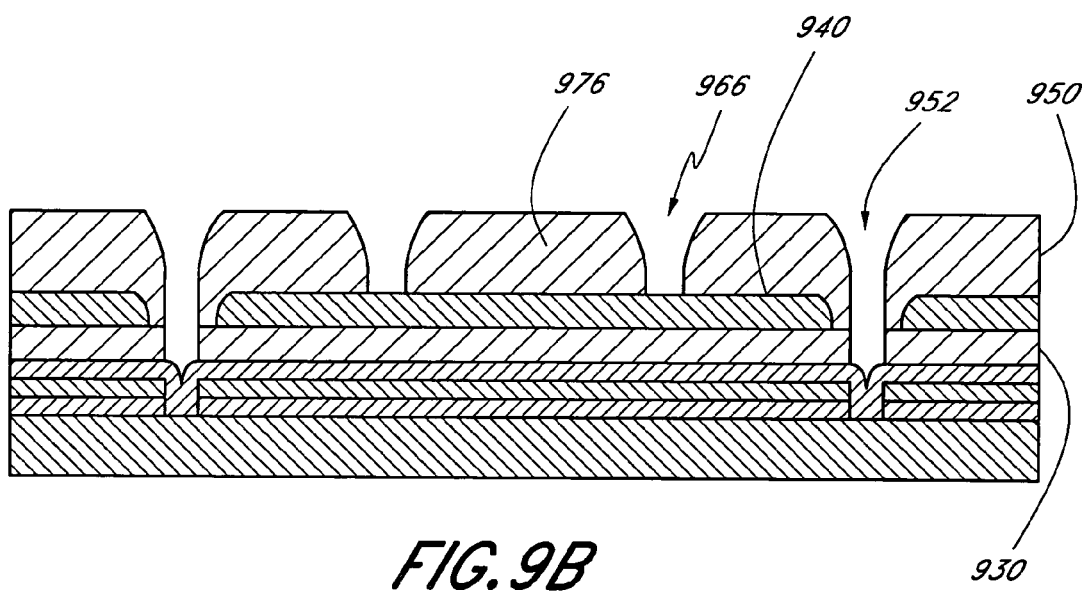

FIG. 9A illustrates in cross section another embodiment of an interferometric modulator 900 comprising a substrate 910, and optical stack 920, a movable mirror 940, a deformable layer 970, and a plurality of support posts 990. A composite connector 972 secures the movable mirror 940 to the deformable layer 970. In the illustrated embodiment, the composite connector 972 comprises an annular first component 974 that forms the sides of the composite connector 972. A second component 976 forms a core in the connector 972. In the illustrated embodiment, the second component 976 is substantially entirely enclosed by the first component 974, the movable conductor 940, and the deformable layer 970. In some embodiments, at least one of the first component 974 and the second component 976 is electrically conductive, thereby electrically connecting the movable conductor 940 and the deformable layer 970 as discussed above. A method for manufacturing the embodiment of the device illustrated in FIG. 9A is described below with reference to FIG. 9B-FIG. 9F.

Figure 10A:
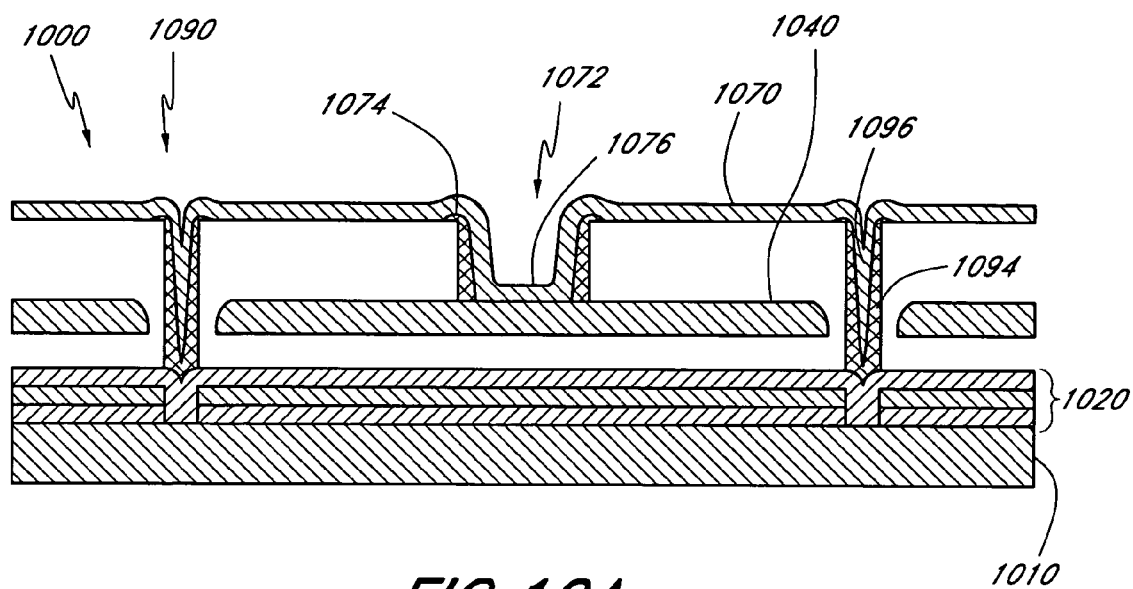
FIG. 10A-FIG. 10D illustrate another embodiment of an interferometric modulator as disclosed herein and intermediate structures in an embodiment of its fabrication.
Figure 10B:
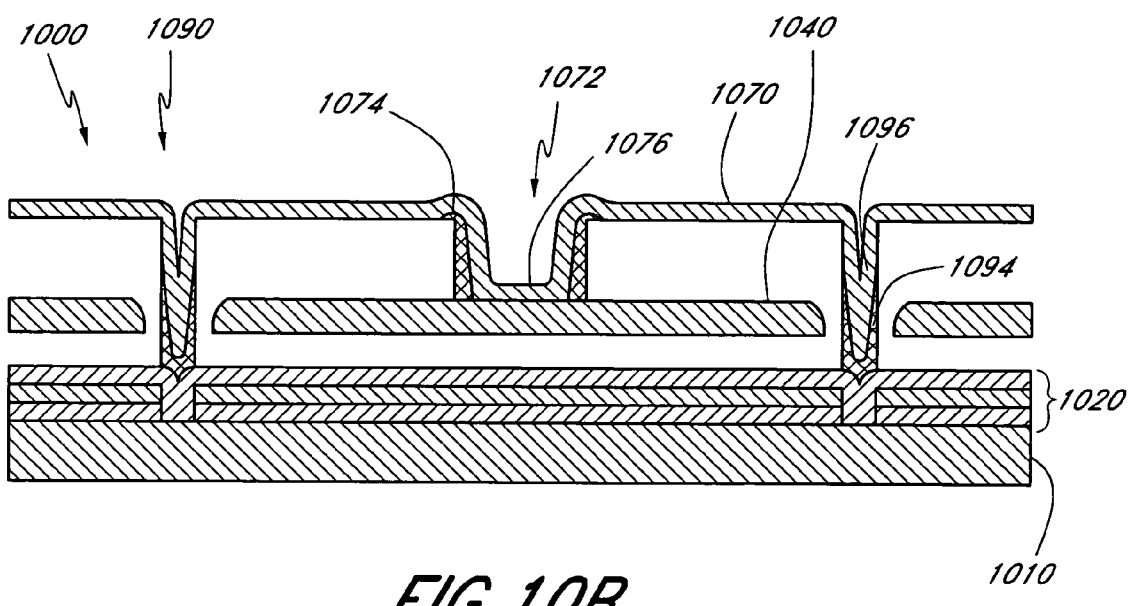

FIG. 10A illustrates in cross section an embodiment of an interferometric modulator 1000 comprising a substrate 1010, an optical stack 1020, a movable mirror 1040, a deformable layer 1070, and a plurality of support posts 1090. The illustrated embodiment comprises a composite connector 1072 comprising a first component 1074 and a second component 1076. The composite connector 1072 is similar to the composite connector 872 illustrated in FIG. 8A and described above. In other embodiments, the connector is not a composite connector, for example, similar to the connector 36 (FIG. 7D). In the illustrated embodiment, the support posts 1090 are composite, comprising a first component 1094 and a second component 1096. In the illustrated embodiment, the first component 1094 is disposed around the periphery of the composite support post 1090. In some preferred embodiments, the first component 1094 is annular, surrounding at least the sides of a lower portion of the second component 1096 of the support post, for example, as illustrated in FIG. 10B. In some preferred embodiments, the first component 1094 substantially entirely surrounds the sides of the second component 1096, thereby forming the sides of the support post 1090, as illustrated in FIG. 10A. In other embodiments the first component 1094 comprises one or more sections that do not form a closed structure around the second component 1096.

Figure 11:
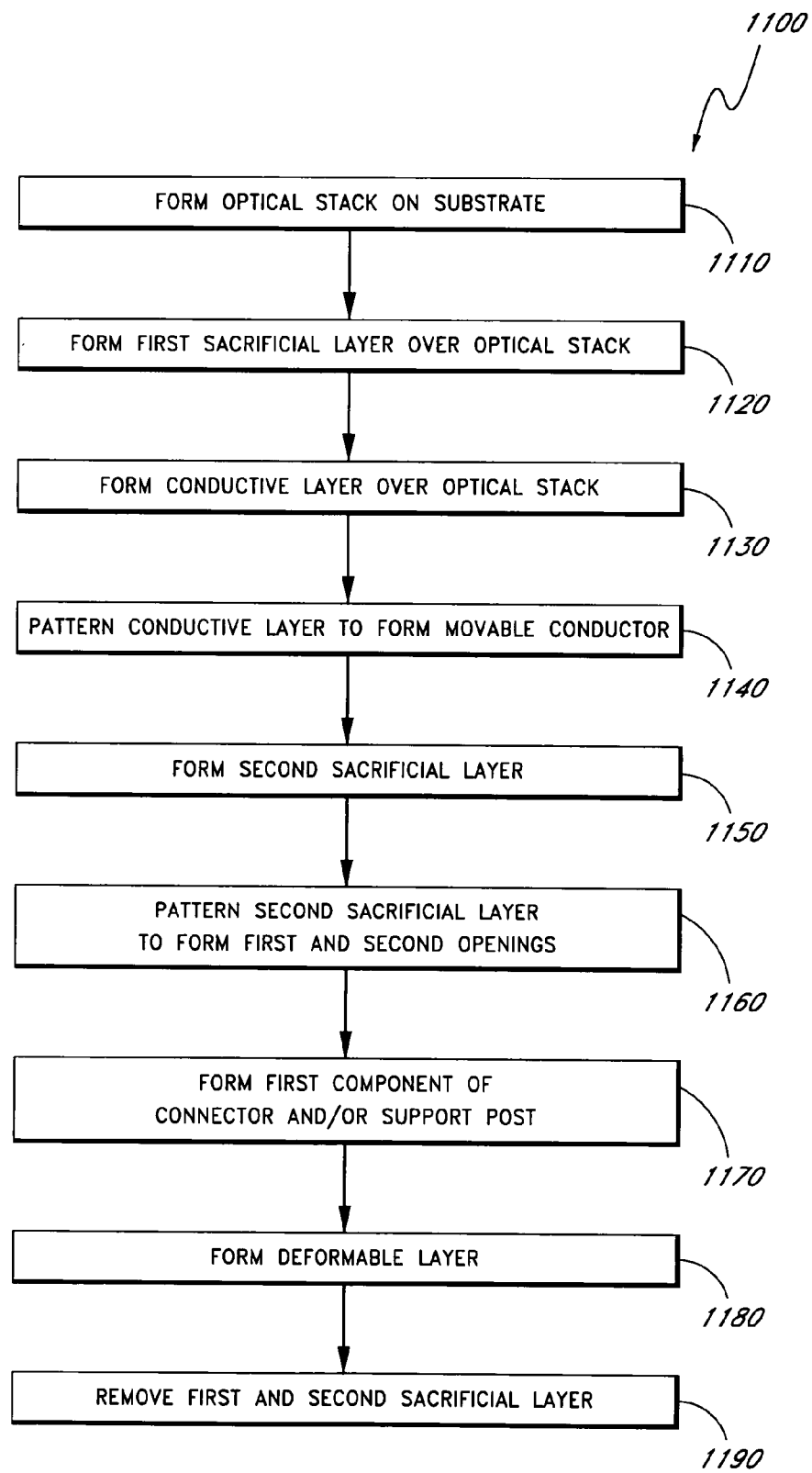
FIG. 11 is a flowchart illustrating an embodiment of a method for synthesizing an interferometric modulator as disclosed herein.

FIG. 11 is a flowchart illustrating an embodiment of a method for fabricating a MEMS device, with reference to the interferometric modulator 800 illustrated in FIG. 8A and FIG. 8F-FIG. 8M, which illustrate intermediate structures in the method.

Figure 8F:
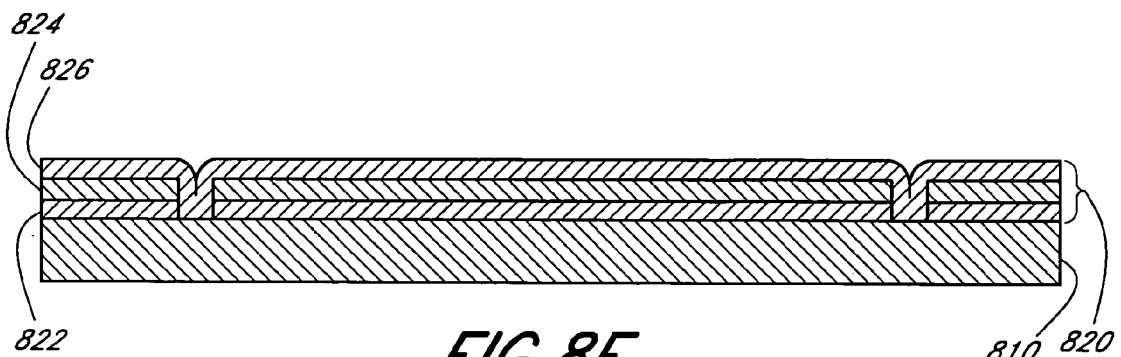
FIG. 8F-FIG. 8M illustrate intermediate structures in an embodiment of the fabrication of the apparatus illustrated in FIG. 8A.

In step 1110, an optical stack 820 is formed on the substrate 810. In some embodiments, the optical stack 820 comprises an electrode layer 822, a partially reflective layer 824, and a dielectric layer 826, as illustrated in FIG. 8F. In the illustrated embodiment, the electrode layer 822 and partially reflective layer 824 are formed on the substrate 820 and patterned to open support regions, which in some preferred embodiments, define rows of lower electrode (not shown). The dielectric layer 826 is then formed thereon.

Figure 8G:
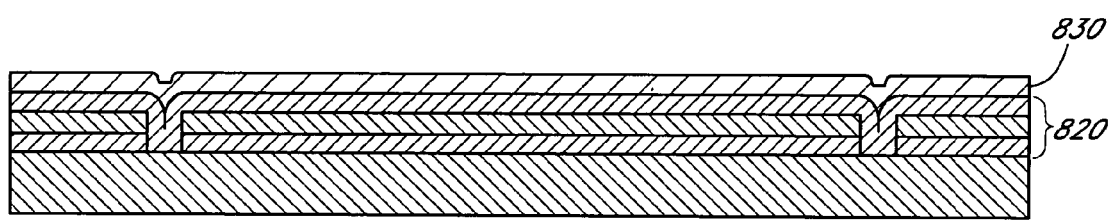

In step 1120, a first sacrificial layer 830 is formed over the optical stack 820, as illustrated in FIG. 8G. The first sacrificial layer 830 comprises a first sacrificial material. Suitable sacrificial materials are known in the art, for example, inorganic sacrificial materials and organic sacrificial materials. Examples of suitable inorganic sacrificial materials include silicon, titanium, zirconium, hafnium, vanadium, tantalum, niobium, molybdenum, and tungsten. Examples of suitable organic sacrificial materials include resists and photoresists. The first sacrificial layer 830 is formed using methods known in the art, which will depend on the particular sacrificial material selected, and include spinning on, physical vapor deposition (PVD), sputtering, chemical vapor deposition (CVD), atomic layer deposition (ALD), and variants thereof. Typically, the first sacrificial material is selectively etchable relative to other materials exposed to the etchant in the finished device. In some preferred embodiments, the first sacrificial material, for example molybdenum, silicon, or tungsten, is etchable using $XeF_2$.

Figure 8H:
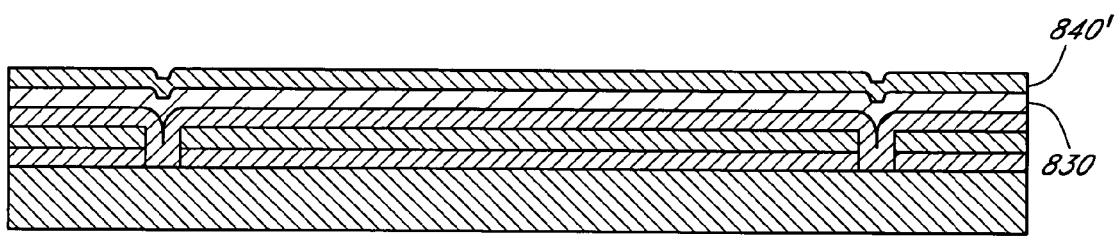

In step 1130, a conductive layer 840' is formed over the first sacrificial layer 830, as illustrated in FIG. 8H. In embodiments in which the device is an interferometric modulator, the conductive layer is also referred to as a "reflective layer" or a "mirror layer." In some embodiments, the conductive layer 840' is a composite structure, comprising a plurality of sub-layers, which permits that optimization of various functions, for example, rigidity, mass, chemical resistance, etch resistance, and/or reflectivity. For example, in some embodiments, the reflective layer comprises, for example, a reflective surface sub-layer comprising aluminum, titanium, chromium, silver, and/or gold. Methods for forming the conductive layer 840' are known in the art, for example, PVD, CVD, ALD, and variants thereof.

Figure 8I:
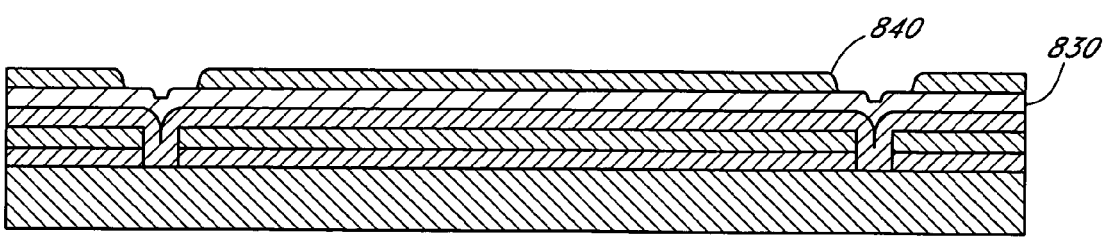

In step 1140, the conductive layer 840' is patterned to form a movable conductor 840 as illustrated in FIG. 8I. As discussed above, in embodiments in which the device is an interferometric modulator, the movable conductor 840 is a movable mirror. In the illustrated embodiment, the first sacrificial layer 830 is not patterned in this step. In other embodiments, first sacrificial layer 830 is patterned to form one or more openings in the first sacrificial material adjacent to the movable conductor 840.

Figure 8J:
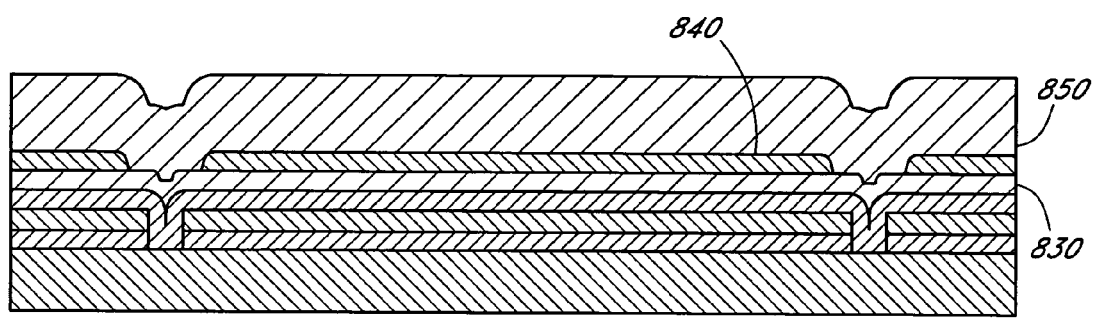
Figure 8K:
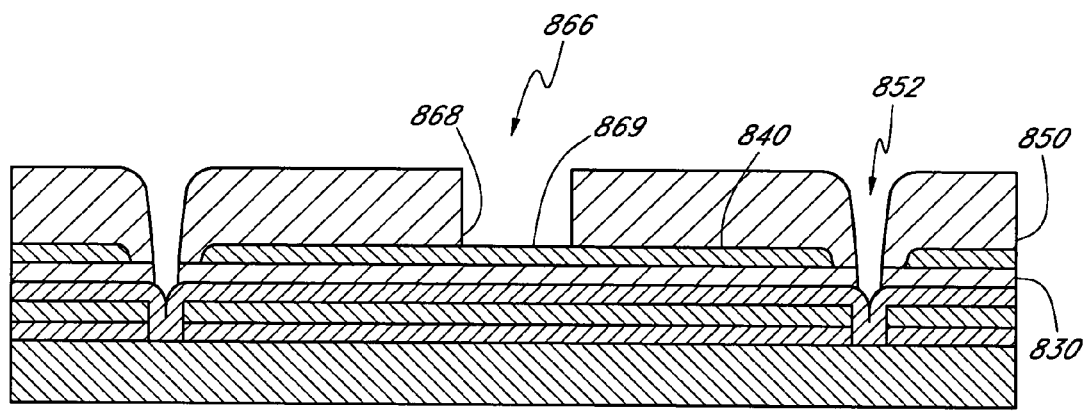

In step 1150, a second sacrificial layer 850 is formed over the movable conductor 840 and the exposed portions of the first sacrificial layer 830, thereby providing the structure illustrated in FIG. 8J. The second sacrificial layer 850 comprises a second sacrificial material, which is independently selected from the same group of materials described above as being suitable for use as the first sacrificial material, and is formed using methods known in the art. In some preferred embodiments, the first and second sacrificial materials are selectively etchable by the same etchant, thereby permitting the removable of both the first 830 and second 850 sacrificial layers in a single release etch, as discussed in greater detail below.

In step 1160, a mask (not illustrated) is formed on the second sacrificial layer 850 by methods known in the art, for example, by photolithographic patterning. One or more first openings 866 in the second sacrificial layers 850 are formed using methods known in the art, for example, etching through the mask, to provide the structure illustrated in FIG. 8K. In the illustrated embodiment the first opening 866 in the second sacrificial layer is substantially centered over the movable conductor 840, which forms at least a portion of the bottom of the first opening 866. Other embodiments comprise a plurality of first openings 866. The illustrated embodiment also comprises second openings 852 through the first 830 and second 850 sacrificial layers, and adjacent to the movable conductor 840. In some embodiments, the first opening 866 and second opening(s) 852 are formed in the same step. In other embodiments, the first opening 866 and second opening(s) 852 are formed in separate steps.

Figure 8L:
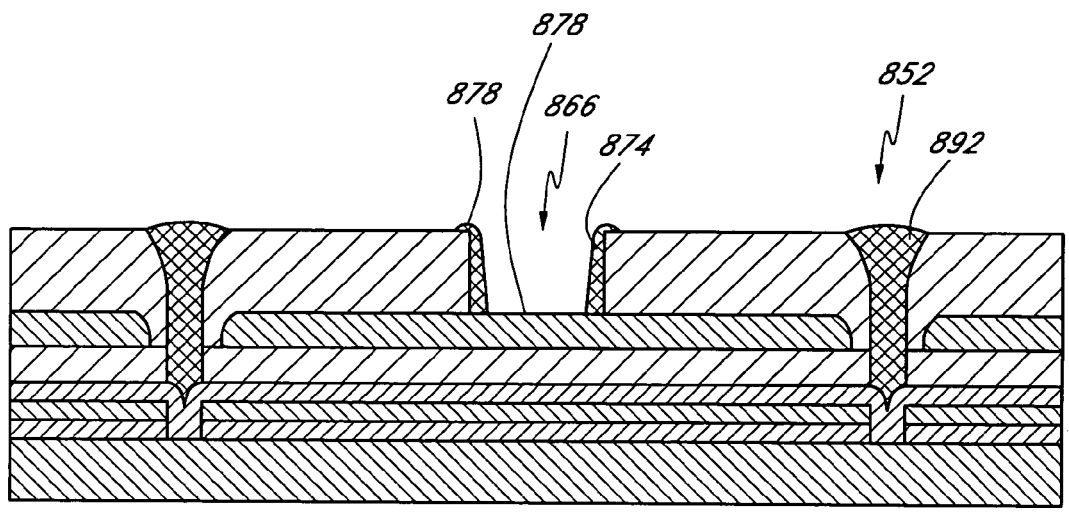

In step 1170, the first component 874 of the composite connector (872 in FIG. 8A) is formed in the first opening 866 in the second sacrificial material from a filler material to provide the structure illustrated in FIG. 8L. In the illustrated embodiment, the filler material, and consequently, the first component 874, substantially covers the side walls 868 of the first opening (FIG. 8K), but does not entirely cover the bottom 869 of the first opening 866. In some embodiments, the filler material does not entirely cover the side walls 868 of the first opening; that is, the thickness of the filler material is less than the height of the opening 866, thereby providing, for example, the first component 874 illustrated in FIG. 8E. Returning to FIG. 8L, the filler material also substantially fills the second opening(s) 852 to form support post plugs 892. In the illustrated embodiment, the first component 874 of the composite connector and the support post plugs 892 comprise the same filler material. Those skilled in the art will understand that in other embodiments, the first component 874 of the composite connector and the support post plugs 892 do not comprise the same filler material. As will be discussed in greater detail below, in some preferred embodiments, the filler material is deposited in a spin-on process.

As used herein, the term "filler material" refers to a material: (1) that provides a surface over which another layer with predetermined properties, for example, adhesion, thickness, physical integrity, and/or electrical integrity, is formed, for example, by filling a step, ledge, and/or discontinuity in the fabrication of a device; and/or (2) that fills an opening to provide a component with predetermined properties in a finished device. Examples of the predetermined properties include, for example, adhesion, physical integrity, and/or electrical conductivity. In some embodiments described herein, the filler material performs both of these functions. In some embodiments, the filler material performs additional functions. Suitable filler materials are known in the art. Those skilled in the art will understand that selecting an appropriate filler material depends on factors including the particular application, the particular materials used, as well as the particular function(s) of the filler material.

Figure 12A:
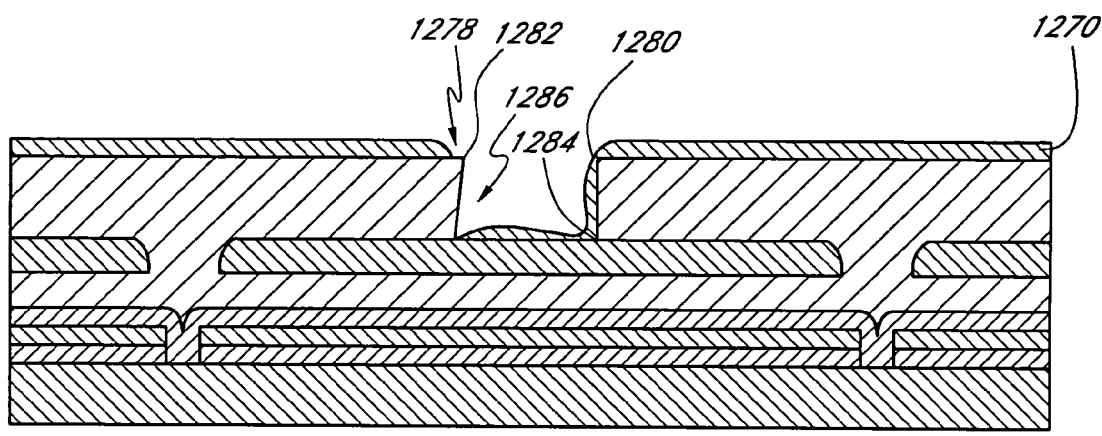
FIG. 12A illustrates various defects in a deformable layer.

Those skilled in the art will understand that, under certain circumstances, forming a layer with the desired properties over some substrates is relatively difficult. For example, forming a deformable layer 1270 over the structure illustrated in FIG. 8L can result in non-uniformities, for example, breaks 1278 or thin portions 1280, in the deformable layer 1270 as illustrated in FIG. 12A. In the illustrated embodiment, the non-uniformities form around discontinuities in the underlying layer. In the illustrated embodiment, the discontinuities include transitions between a surface and an opening 1282, transitions between the wall of an opening and the bottom of an opening 1284, and reentrant regions 1286. Those skilled in the art will understand that certain types of layers are also difficult to form over other types of features, for example, steep, rough, and/or irregular surfaces.

Figure 12B:
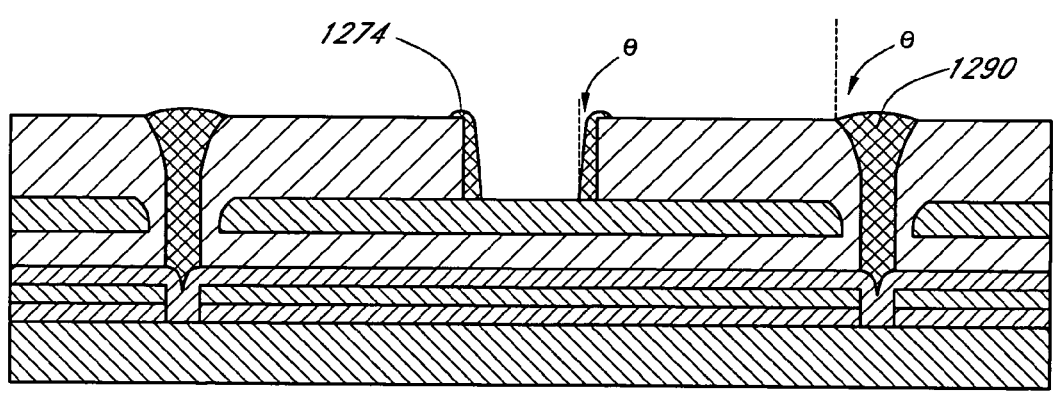
FIG. 12B illustrates representative contact angles (&) for the filler material.

With reference to FIG. 12A, in some embodiments, the filler material facilitates forming a layer over such a substrate by filling or covering at least some of the discontinuities in the substrate. In some embodiments, the filler material of the first component 1274 of the connector and/or support post 1290 forms a contact angle $\Theta$ that is greater than 0° (i.e., non-reentrant), more preferably, greater than about 10°, as illustrated in FIG. 12B.

In some preferred embodiments, the filler material comprises a self-planarizing material, for example, a resist, a photoresist, a spin-on glass (SOG), or a spin-on dielectric (SOD). In other embodiments, the filler material comprises another material, for example, a planarizing material, a polymer, and/or a conformal coating. As used herein, the term "self-planarizing" is used in its usual meaning, and in particular, to refer to materials that, when applied to a surface, tend to fill and/or cover openings, irregularities, and/or features on the surface, thereby providing a smoother exposed surface. Those skilled in the art will understand that the surface formed by a self-planarizing material does not necessarily define a plane. Suitable photoresists include positive resists and negative resists, including epoxy, polyimide, polyacrylate, i-line, g-line, 193 nm, deep-UV, and/or thick-film resists. Exemplary commercially available photoresists include SU-8 (MicroChem, Inc., Newton, Mass.), SPR3600 (Shipley, Marlborough, Mass.), SPR995-CM (Shipley), Ultra-i-123 (Shipley), AZ-9200 (Clariant, Muttenz, Switzerland), P4000 (Clariant), AZ MiR 700 (Clariant), AZ 7900 (Clariant), AZ5200 (Clariant), AZ DX (Clariant), and NR-7 (Futurex). Methods for applying self-planarizing materials are well known in the art, for example, spin coating. In some embodiments, the photoresist is photopatterned. In some embodiments, the photoresist is photopatterned by irradiation through the substrate 810, i.e., from the bottom of the device 800 as viewed in FIG. 8A. In some embodiments, the irradiation comes from above the device 800 as viewed in FIG. 8A. In some embodiments, the photoresist is irradiated from both sides. In some embodiments a second photoresist is applied to the filler material and photopatterned in order to pattern the filler material.

The properties of the self-planarizing material are controlled by methods known in the art. For example, in the application of a spin-on material, factors including spin speed and dilution affect the thickness of the film of spin-on material as well as the height of its features. In some embodiments, the spin speed affects the thickness of a lip 878 of the first component (FIG. 8L), while maintaining a thinner layer of resist in the opening. Other factors affecting the properties of the self-planarizing material include the bake history, for example, before and after photopatterning. For example, baking tends to shrink a photoresist. Some embodiments include a plasma descum step. Both the bake history and plasma descum affect the profile and height of the resist. In some embodiments, the plasma descum removes resist from the bottom 869 of the first opening 866 and/or second opening 852 after forming the first component of the connector and/or support post (874 and 894, respectively). As discussed above, exposing the movable conductor 840 on the bottom 869 of the first opening 866 is useful in some embodiments of the disclosed device in which the first component 874 of the connector is not electrically conductive. In some embodiments, the plasma descum also improves the adhesion of layers deposited on the self-planarizing material (for example, the first component 874), possibly by roughening the surface of the resist.

Other suitable filler materials include dielectric materials of any type known in the art, for example, metal oxides, nitrides and/or carbides. Examples of suitable dielectric materials include silicon oxide, silicon nitride, silicon carbide, fluorinated silica glass, organosilicate glass, aluminum oxide, and combinations thereof. Other dielectrics known in the art are also suitable. Another suitable filler material is a metal, for example, aluminum, copper, gold, tungsten, nickel, titanium, and the like, and alloys or mixtures thereof. Another suitable filler material is silicon, either epitaxial, polycrystalline, or amorphous. Methods for depositing such filler materials are known in the art, for example, CVD, PVD, ALD, electroplating, evaporation, sputtering, and lift off. A preferred method for depositing the filler material is spinning on, which reduces or eliminates the need for a directional or "spacer" etch to expose the movable conductor or mirror 840 (FIG. 8L) at bottom 869 of the first opening 866.

Figure 8M:
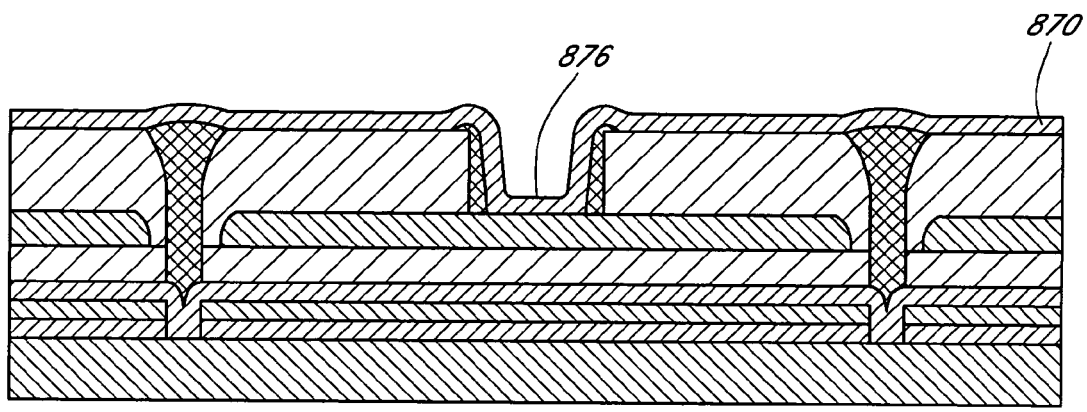

In step 1180, the deformable layer 870 is formed over the structure illustrated in FIG. 8L using methods known in the art to provide the structure illustrated in FIG. 8M. In the illustrated embodiment, the second component 876 of the connector is integrally formed with the deformable layer 870.

In step 1190, the first sacrificial layer 830 and the second sacrificial layer 850 are removed and/or etched away to open the cavities above and below the movable conductor or mirror 840, to provide the structure illustrated in FIG. 8A. In some embodiments, the first 830 and second 850 sacrificial layers are removed in a sacrificial or "release etch." The first 830 and the second 850 sacrificial layers are removed either in separate processes or in a single process. Those skilled in the art will understand that the particular etching conditions depend on the identity of the first and second sacrificial materials. In some embodiments, the one or both of the sacrificial materials are selectively removed relative to other structures in the device, for example, the structures illustrated in FIG. 8A. In some preferred embodiments, one or both of the first and second sacrificial materials is selectively etchable using a gas phase etchant (e.g., $XeF_2$).

Figure 9C:
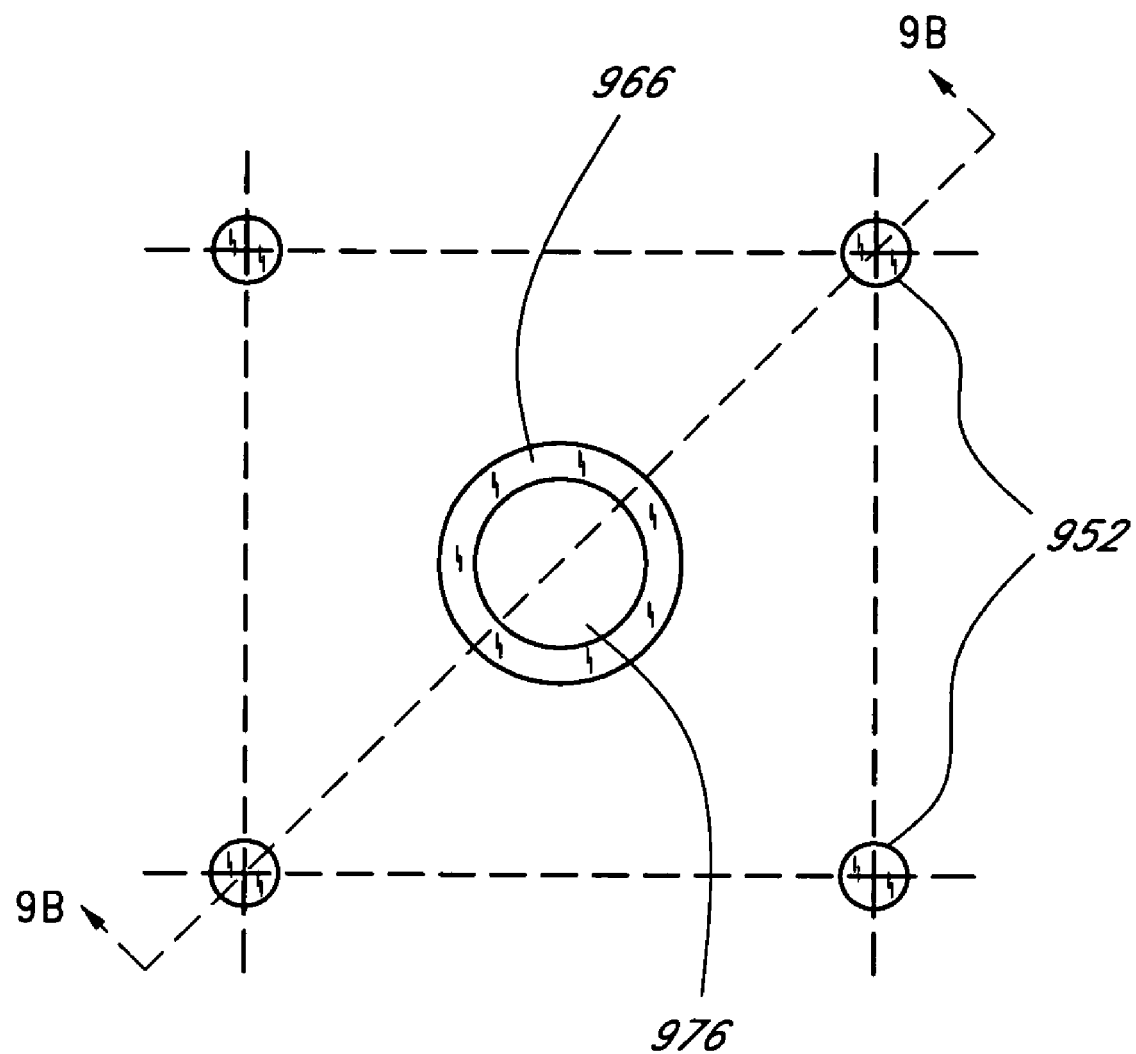

Method 1100 is also useful for fabricating the MEMS device illustrated in FIG. 9A. Steps 1110-1150 are substantially as described above, and as illustrated in FIG. 8F-FIG. 8J. In step 1160, at least one first opening 966 and one or more second openings 952 and are formed in a second sacrificial layer 950 and first sacrificial layer 930 to provide the structure illustrated in FIG. 9B. Viewed from the top (FIG. 9C), the first opening 966 is annular, defining a portion 976 of the second sacrificial layer, which forms the second component of the connector 972 (FIG. 9A). For example, in some embodiments, the first opening 966 is a circle as illustrated in FIG. 9C. In other embodiments, the first opening 966 has another shape, for example, a square, rectangle, hexagon, an ellipse, or another shape. In some embodiments, the first opening 966 is not annular. In some of these embodiments, the release etch described above etches away the portion 976 of the second sacrificial layer in step 1190. In some of these embodiments, the first component 974 of the connector electrically connects the movable conductor 940 to the deformable layer 970 (FIG. 9A), and consequently, the filler material is electrically conductive.

Figure 9D:
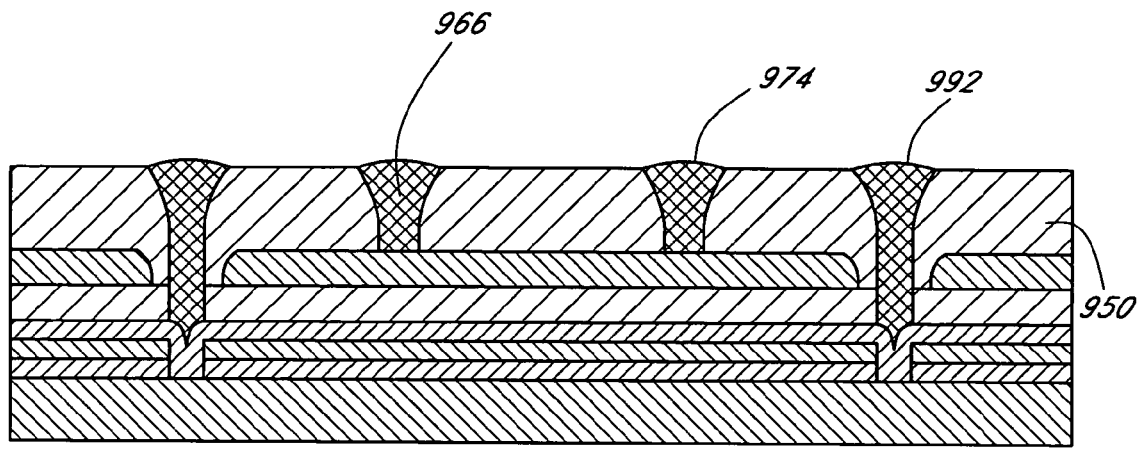
Figure 9E:
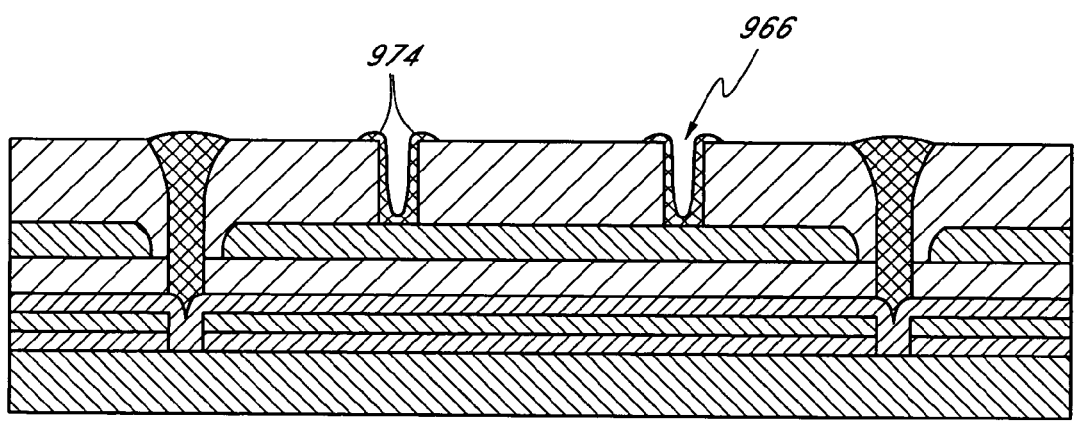

In step 1170, a first component 974 of the connector is formed from a filler material to provide the structure illustrated in FIG. 9D. In the illustrated embodiment, the filler material substantially fills the first opening 966 in the second sacrificial layer 950 to form the first component 974. In other embodiments, the filler material does not substantially fill the first opening 966, thereby providing, for example, a first component 974 as illustrated in FIG. 9E. Returning to FIG. 9D, in the illustrated embodiment, support plug posts 992 are also formed in this step, as described above. The filler material and method of application are substantially as described above.

Figure 9F:
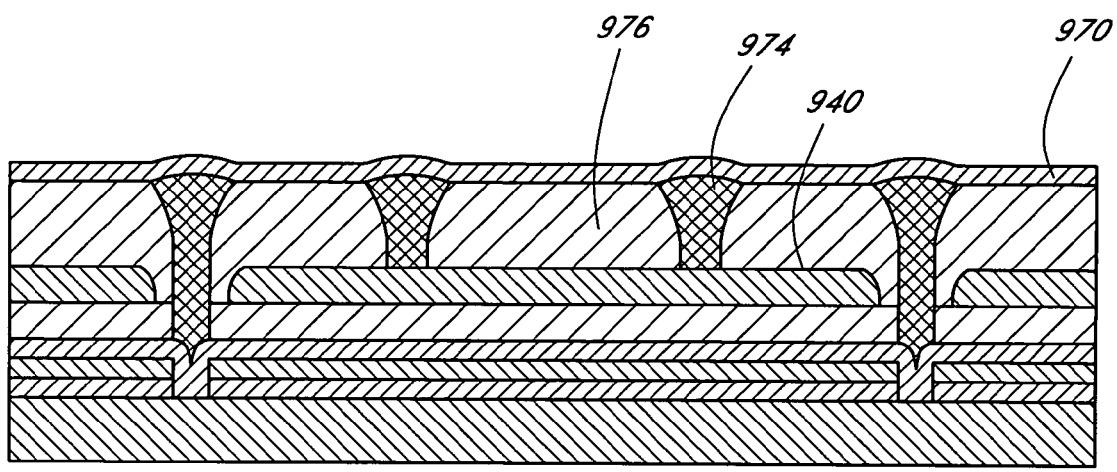

In step 1180, the deformable layer 1070 is formed as discussed above to provide the structure illustrated in FIG. 9F. In step 1190, the first and second sacrificial layers 830 and 850 are removed as discussed above to provide the structure illustrated in FIG. 9A. As best seen in FIG. 9F, in embodiments in which first component 974 of the connector forms a closed shape, the movable mirror 940, deformable layer 970, and first component 974 of the connector, together encase a piece 976 of the second sacrificial material, thereby preventing its etching and forming the second component 976 of the connector.

As discussed above, in some embodiments, at least one of the first component 974 and second component 976 is electrically conductive. In some preferred embodiments, the second component 976 comprises an electrically conductive sacrificial material, for example molybdenum or tungsten.

Figure 10C:
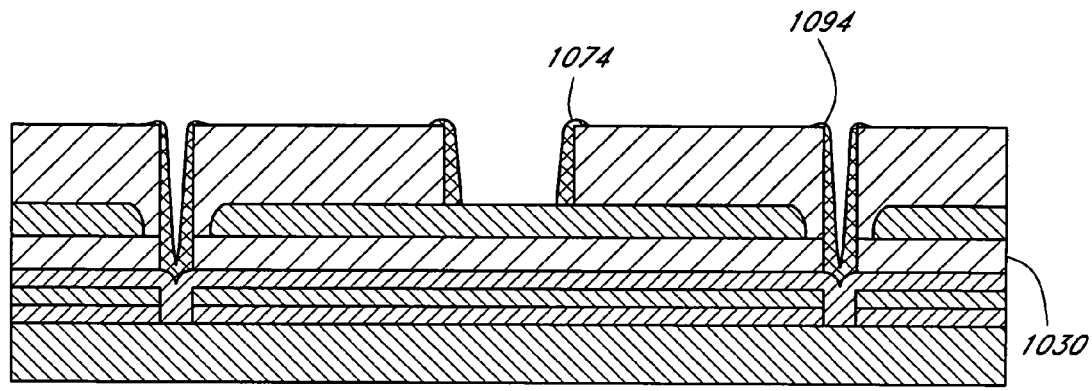
Figure 10D:
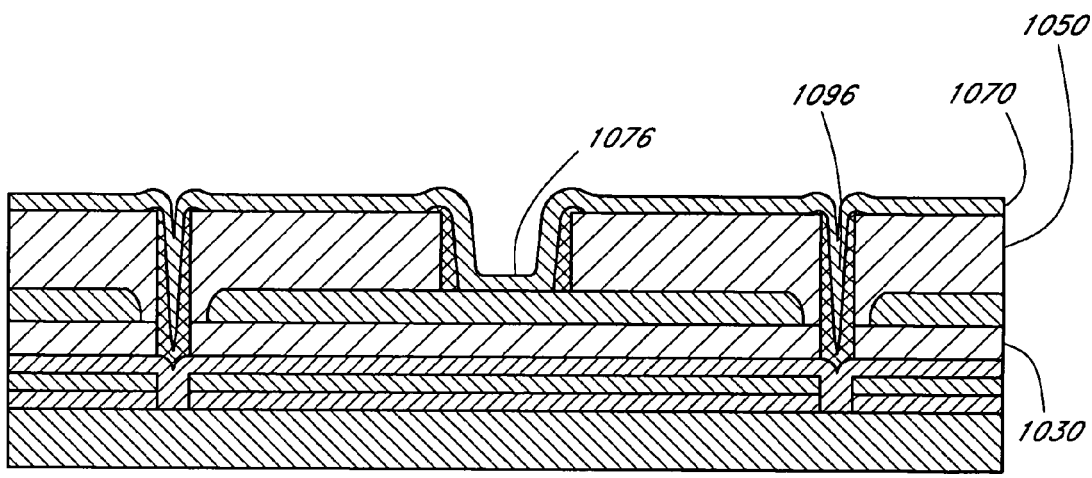

Method 1100 also provides a method for fabricating the apparatus illustrated in FIG. 10A. Steps 1110-1160 are substantially as described above, and as illustrated in FIG. 8F-FIG. 8K. In step 1170, a first component 1094 of the support post and a first component 1074 of the connector are simultaneously formed from a filler material as discussed above to provide the structure illustrated in FIG. 10C. In step 1180, a deformable layer 1070 is formed, which forms the second component 1096 of the support post, as illustrated in FIG. 10D, as well as the second component 1076 of the connector. In step 1190, the first and second sacrificial layers 1030 and 1050 are removed to form the structure illustrated in FIG. 10A.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A microelectromechanical systems device comprising:
   a substrate;
   a deformable layer;
   a support structure supporting the deformable layer;
   a movable conductor positioned vertically between the substrate and the deformable layer, wherein at least a portion of the movable conductor is electrically conductive; and
   a connector securing the movable conductor to the deformable layer vertically below the deformable layer;
   wherein
   at least one of the connector and the support structure comprises a first component and a second component,
   at least a portion of the first component is disposed on a perimeter of at least one of the connector and the support structure such that at least a portion of the first component is horizontally adjacent to and forms sides of at least a lower portion of the second component;
   the second component forms a core of the at least one of the connector and the support structure; and
   the first component comprises a non-electrically conductive filler material, wherein the filler material is a spin-on material.

2. The microelectromechanical systems device of claim 1, wherein the support structure comprises a plurality of support posts, wherein the support posts are supported by the substrate and support the deformable layer.

3. The microelectromechanical systems device of claim 1, wherein the filler material comprises a self-planarizing material.

4. The microelectromechanical systems device of claim 1, wherein the filler material comprises a material selected from the group consisting of a dielectric material, a metal, and silicon.

5. The microelectromechanical systems device of claim 1, wherein the connector and deformable layer are integrated.

6. The microelectromechanical systems device of claim 1, wherein
   the connector comprises a first component and a second component, and
   the first component is annular, forming the sides of at least a portion of the connector.

7. The microelectromechanical systems device of claim 6, wherein the first component forms the sides of the entire connector.

8. The microelectromechanical systems device of claim 7, wherein the second component comprises a sacrificial material.

9. The microelectromechanical systems device of claim 8, wherein the sacrificial material comprises molybdenum, silicon, or a combination thereof.

10. The microelectromechanical systems device of claim 1, wherein at least one support post comprises a support post plug substantially formed from filler material.

11. The microelectromechanical systems device of claim 1, wherein the microelectromechanical systems device is an optical modulator.

12. The microelectromechanical systems device of claim 1, wherein:
   the connector comprises a first component, and
   the first component contacts the movable conductor and forms the sides of the lower portion of the connector.

13. The microelectromechanical systems device of claim 12, wherein the second component comprises a conductor.

14. The microelectromechanical systems device of claim 1, further comprising:
   a display;
   a processor that is in electrical communication with said display, said processor being configured to process image data;
   a memory device in electrical communication with said processor.

15. The microelectromechanical systems device of claim 14, further comprising:
   a driver circuit configured to send at least one signal to said display.

16. The microelectromechanical systems device of claim 15, further comprising:
   a controller configured to send at least a portion of said image data to said driver circuit.

17. The microelectromechanical systems device of claim 14, further comprising:
   an image source module configured to send said image data to said processor.

18. The microelectromechanical systems device of claim 17, wherein said image source module comprises at least one of a receiver, transceiver, and transmitter.

19. The microelectromechanical systems device of claim 14, further comprising:
   an input device configured to receive input data and to communicate said input data to said processor.

* * * * *